United States Patent
Tohoda

(10) Patent No.: US 10,840,393 B2
(45) Date of Patent: Nov. 17, 2020

(54) SOLAR CELL MODULE AND SOLAR CELL MODULE MANUFACTURING METHOD

(71) Applicant: Panasonic Intellectual Property Management Co., Ltd., Osaka (JP)

(72) Inventor: Satoshi Tohoda, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 249 days.

(21) Appl. No.: 14/834,215

(22) Filed: Aug. 24, 2015

(65) Prior Publication Data

US 2015/0364616 A1    Dec. 17, 2015

Related U.S. Application Data

(63) Continuation of application No. PCT/JP2013/007088, filed on Dec. 3, 2013.

(30) Foreign Application Priority Data

Feb. 26, 2013  (JP) ................................ 2013-035820
Sep. 30, 2013  (JP) ................................ 2013-203616

(51) Int. Cl.
| | |
|---|---|
| *H01L 31/0216* | (2014.01) |
| *H01L 31/0352* | (2006.01) |
| *H01L 31/054* | (2014.01) |
| *H01L 31/0747* | (2012.01) |
| *H01L 31/0236* | (2006.01) |

(Continued)

(52) U.S. Cl.
CPC .. *H01L 31/02168* (2013.01); *H01L 31/02363* (2013.01); *H01L 31/022425* (2013.01); *H01L 31/022441* (2013.01); *H01L 31/035281* (2013.01); *H01L 31/054* (2014.12);
(Continued)

(58) Field of Classification Search
CPC ....... H01L 31/022425; H01L 31/02168; H01L 31/022441; H01L 31/02363; H01L 31/035281; H01L 31/0747; H01L 31/054
See application file for complete search history.

(56) References Cited

U.S. PATENT DOCUMENTS 5,389,159 A * 2/1995 Kataoka ............. H01L 31/0392
136/251
2002/0185170 A1  12/2002 Shiotsuka et al.
(Continued)

FOREIGN PATENT DOCUMENTS

DE    102006035965 A1    2/2008
JP       61-226972 A    10/1986
(Continued)

OTHER PUBLICATIONS

International Search Report PCT/JP2013/007088 dated Jan. 14, 2014 with English translation.

*Primary Examiner* — Matthew T Martin
(74) *Attorney, Agent, or Firm* — McDermott Will & Emery LLP

(57) ABSTRACT

A solar cell module includes: a solar cell element that has a surface; a first sealing layer that is provided on the surface; and a light diffusion portion that is provided between an outer peripheral area C1 of the surface and the first sealing layer in such a manner that the light diffusion portion has a curvature and that contains a resin having a reflectivity higher than that of the first sealing layer.

12 Claims, 33 Drawing Sheets

(51) Int. Cl.
*H01L 31/0224* (2006.01)
*H01L 31/18* (2006.01)

(52) U.S. Cl.
CPC .......... *H01L 31/0747* (2013.01); *H01L 31/18* (2013.01); *Y02E 10/52* (2013.01)

(56) References Cited

U.S. PATENT DOCUMENTS

| | | | |
|---|---|---|---|
| 2009/0107547 A1* | 4/2009 | Nakashima | H01L 31/02168 136/256 |
| 2009/0178704 A1* | 7/2009 | Kalejs | B32B 17/10743 136/246 |
| 2010/0263722 A1 | 10/2010 | Kubo et al. | |
| 2012/0048375 A1 | 3/2012 | Hsu et al. | |
| 2012/0125397 A1* | 5/2012 | Okada | H01L 31/022425 136/244 |
| 2013/0037085 A1 | 2/2013 | Werner et al. | |
| 2013/0206210 A1 | 8/2013 | Niinobe et al. | |
| 2013/0247963 A1* | 9/2013 | Ishiguro | H01L 31/048 136/251 |

FOREIGN PATENT DOCUMENTS

| | | | | |
|---|---|---|---|---|
| JP | 9-260696 A | 10/1997 | | |
| JP | 2009-147363 A | 7/2009 | | |
| JP | 2012-069566 A | 4/2012 | | |
| JP | WO 2012073751 A1 * | 6/2012 | .......... | H01L 31/048 |
| JP | 2012-238785 | 12/2012 | | |
| WO | 2012/033205 | 3/2012 | | |
| WO | WO-2012026806 A1 * | 3/2012 | ....... | H01L 31/02161 |

\* cited by examiner

80

SOLAR CELL MODULE AND SOLAR CELL MODULE MANUFACTURING METHOD

RELATED APPLICATION

This Application is a Continuation Application of PCT/JP2013/007088 filed Dec. 3, 2013, which claims priority to Japanese Patent Application No. 2013-035820, filed on Feb. 26, 2013, and Japanese Patent Application No. 2013-203616, filed on Sep. 30, 2013, the entire content of each is incorporated herein by reference.

BACKGROUND

1. Field of the Invention

The present invention relates to a solar cell module and a solar cell module manufacturing method.

2. Description of the Related Art

Due to manufacturing processes, an invalid area can be provided on a light-receiving surface, which is a light-incident surface, of a solar cell that is unlikely to contribute to the generation of electricity even when light is incident on an area located at the outer periphery of the light-receiving surface. In a solar cell in which such an invalid area is provided, a structure has been suggested where a light diffusion sheet is provided on the invalid area so as to effectively utilize incident light by diffusing light that is incident on the invalid area.

In order to effectively utilize light, a structure is desirably employed that allows light incident on an invalid area such as the one described above to be more effectively scattered toward an area that contributes to the generation of electricity.

SUMMARY

In this background, a purpose of the present invention is to provide a technology for improving the efficiency of the generation of electricity of a solar cell module.

A solar cell module according to one embodiment of the present invention includes: a solar cell element; a sealing layer that is provided on a surface of the solar cell element; and a light diffusion portion that is provided between an invalid area of the surface and the sealing layer in such a manner that the light diffusion portion has a curvature.

Another embodiment of the present invention relates to a solar cell module manufacturing method. This method includes: preparing a solar cell element that has a surface and a sealing layer that seals the solar cell element; applying, via a printing plate that has a pattern corresponding to an invalid area of the surface, to the invalid area a coating that contains a resin having a reflectivity higher than that of the solar cell element; and sealing, with the sealing layer, the solar cell element on which the coating is printed.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Figure 1:
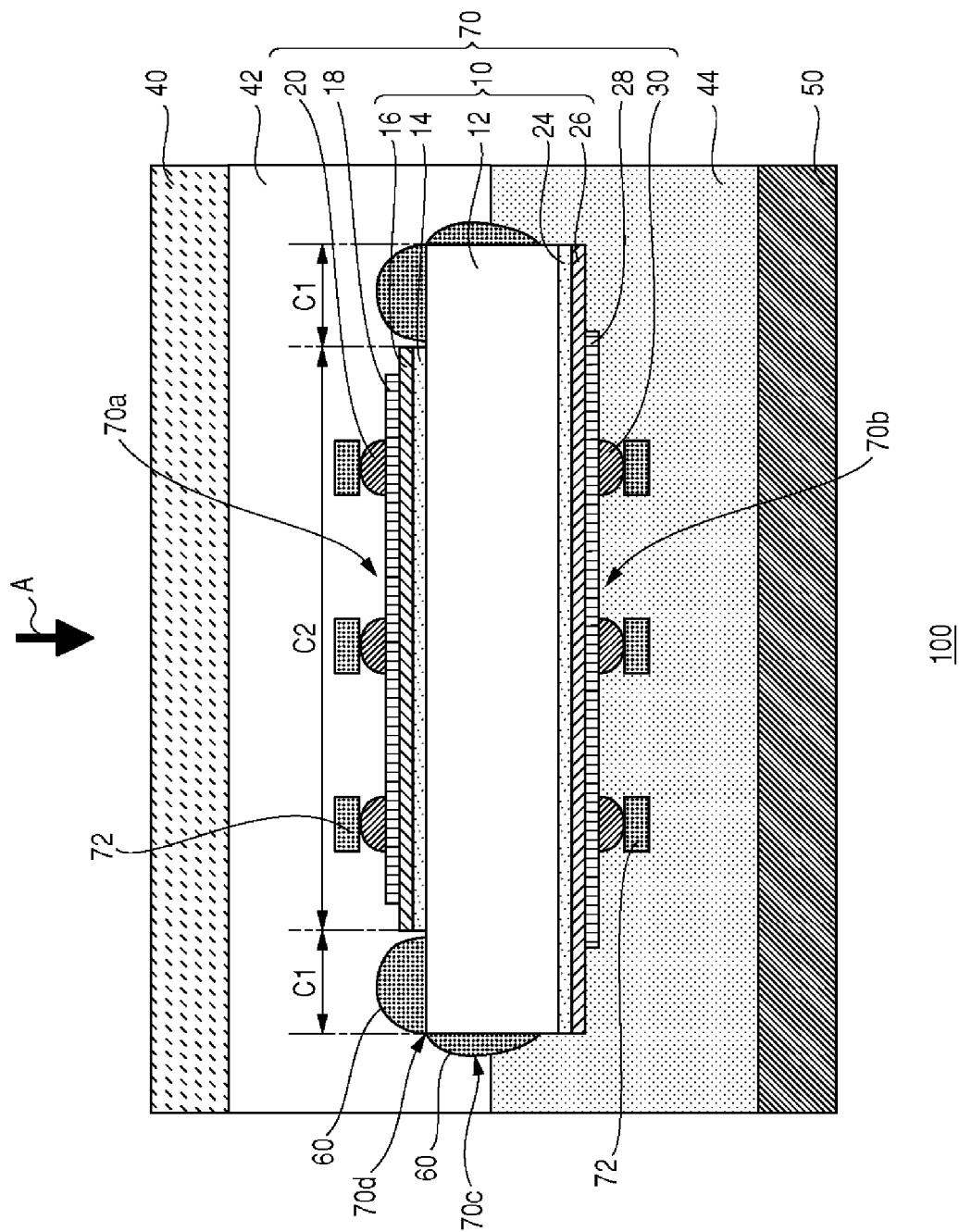
FIG. 1 is a cross-sectional view illustrating the structure of a solar cell module according to an embodiment of the present invention.

The invention will now be described by reference to the preferred embodiments. This does not intend to limit the scope of the present invention, but to exemplify the invention.

A detailed description of an embodiment to implement the present invention will be given with reference to the drawings. In the explanations of the figures, the same elements shall be denoted by the same reference numerals, and duplicative explanations will be omitted appropriately.

Figure 2:
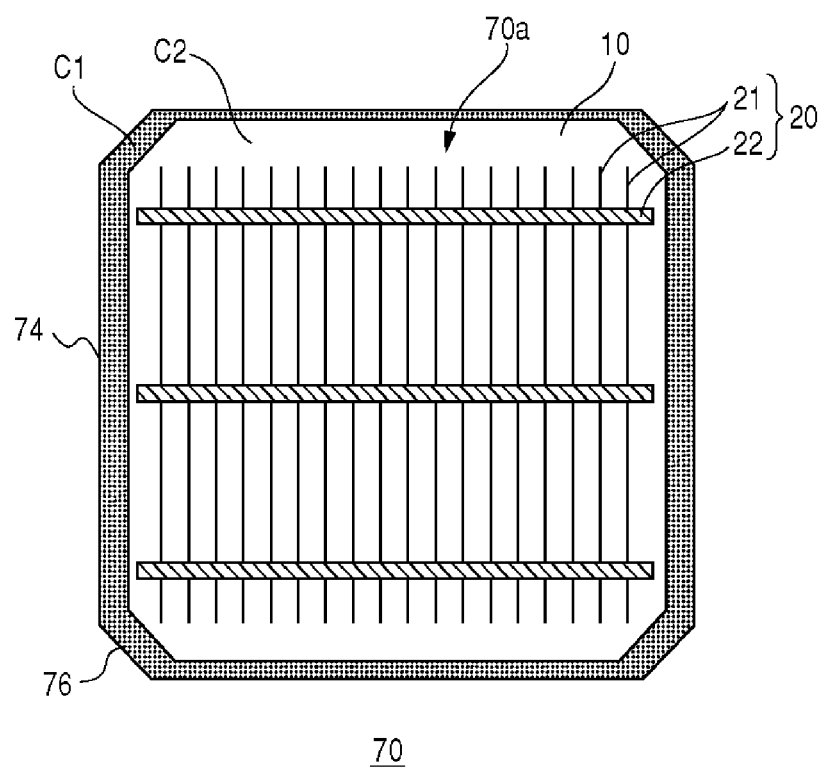
FIG. 2 is a diagram illustrating an outer peripheral area of a solar cell element according to the embodiment of the present invention.

FIG. 1 is a cross-sectional view illustrating the structure of a solar cell module 100 according to a first embodiment. FIG. 2 is an external view illustrating a solar cell element 70 viewed from the side of a light-receiving surface 70a.

The solar cell module 100 according to the present embodiment is provided with: the solar cell element 70; a light diffusion portion 60 provided in an outer peripheral area C1 of the light-receiving surface 70a, which is one of the surfaces of the solar cell element 70, in such a manner that the light diffusion portion 60 has a curvature; and tab wiring 72 that connects adjacent solar cell elements 70 with each other. In the solar cell element 70, a part of a semiconductor layer that constitutes an electricity generation layer 10 is not formed in the outer peripheral area C1 of the light-receiving surface 70a in order to prevent a short circuit between a semiconductor layer on the side of the light-receiving surface 70a and a semiconductor layer on the side of a back surface 70b in the course of manufacturing the electricity generation layer 10. Therefore, the outer peripheral area C1 is an invalid area that is unlikely to contribute to the generation of electricity even when light becomes incident.

Since the light diffusion portion 60 has a reflectivity that is higher than that of the solar cell element 70, the light diffusion portion 60 has a light diffusivity for incident light and scatters light that is incident on the outer peripheral area C1 so that the light that is scattered heads to a valid area C2, which contributes to the generation of electricity, of the solar cell element 70. The light diffusion portion 60 is raised to form a convex surface with a gentle curvature. Thus, the light diffusion portion 60 is capable of effectively scattering incident light that is heading to the outer peripheral area C1. This allows light that is to be absorbed in the invalid area to be reflected so that the light is absorbed in the valid area C2 so as to contribute to the generation of electricity, and the efficiency of the generation of electricity of the solar cell element 70 can be improved compared to a case where the light diffusion portion 60 is not provided.

Although not particularly illustrated, the solar cell module 100 is provided with a plurality of solar cell elements 70. A solar cell element 70 is provided with an electricity generation layer 10, a first transparent electrode layer 18, a first metal electrode 20, a second transparent electrode layer 28, and a second metal electrode 30. The electricity generation layer 10 is provided with a base substrate 12, a first i-type layer 14, a first conductivity type layer 16, a second i-type layer 24, and a second conductivity type layer 26.

The base substrate 12 is, for example, a crystalline semiconductor layer and is a monocrystalline semiconductor layer or a polycrystalline semiconductor layer in which a number of crystalline grains are congregated. An n-type crystalline silicon substrate is used as the base substrate 12, and the doping concentration is set to be around $10^{16}/cm^3$. As described later in FIG. 3, a texture structure for improving the light absorption efficiency of the solar cell element 70 is provided for the base substrate 12.

The first i-type layer 14 and the first conductivity type layer 16 are non-crystalline semiconductor layers and are semiconductor layers that include an amorphous phase or a microcrystalline phase where fine crystal grains are precipitated in an amorphous phase. In this embodiment, the semiconductor layers are amorphous silicon that contains hydrogen. The first i-type layer 14 is substantially intrinsic amorphous silicon, and the first conductivity type layer 16 is p-type amorphous silicon. The dopant concentration of the first conductivity type layer 16 is higher than that of the first i-type layer 14.

The first i-type layer 14 and the first conductivity type layer 16 are not formed in the outer peripheral area C1 of the base substrate 12 and are formed in the valid area C2, which is an area that is inside only by a given distance.

The second i-type layer 24 and the second conductivity type layer 26 are non-crystalline semiconductor layers and are semiconductor layers that include an amorphous phase or a microcrystalline phase where fine crystal grains are precipitated in an amorphous phase. In this embodiment, the semiconductor layers are amorphous silicon that contains hydrogen. The second i-type layer 24 is substantially intrinsic amorphous silicon, and the second conductivity type layer 26 is n-type amorphous silicon. The dopant concentration of the second conductivity type layer 26 is higher than that of the second i-type layer 24.

For the first transparent electrode layer 18 and the second transparent electrode layer 28, at least one or a combination of a plurality of transparent conductive oxides (TCO) in which tin (Sn), antimony (Sb), tungsten (W), fluorine (F), aluminum (Al), or the like is doped in a stannic oxide ($SnO_2$), a zinc oxide (ZnO), an indium tin oxide (ITO), or the like is preferably used.

The first transparent electrode layer 18 is formed in an area that is further inside the valid area C2. Similarly, the second transparent electrode layer 28 is formed in an area that is further inside, by a given distance, the area in which the second i-type layer 24 and the second conductivity type layer 26 are formed. This is for the purpose of preventing a short circuit between the set of the first transparent electrode layer 18 and the second transparent electrode layer 28 and the base substrate 12.

In the present embodiment, the side of the first transparent electrode layer 18 of the solar cell element 70 serves as the light-receiving surface 70a. A light-receiving surface means a principal surface on which light (sunlight) mainly becomes incident in the solar cell element 70 and, specifically, a surface on which the major portion of light that enters the solar cell element 70 becomes incident. As shown in FIG. 2, the light-receiving surface 70a has an octagonal shape formed by four long sides 74 and four short sides 76.

The first metal electrode 20 and the second metal electrode 30 are electrodes used to take out electricity generated by the electricity generation layer 10. The first metal electrode 20 is provided on the light-receiving surface 70a of the solar cell element 70, and the second metal electrode 30 is provided on the back surface 70b that faces the light-receiving surface 70a. The first metal electrode 20 and the second metal electrode 30 are conductive materials containing, for example, copper (Cu) or aluminum (Al). The first metal electrode 20 and the second metal electrode 30 may contain an electrolytic plating layer of copper (Cu), tin (Sn), or the like. However, the examples given are non-limiting. Other metals such as gold, silver, and the like, other conductive materials, or a combination of those may be used.

The solar cell module 100 is provided with tab wiring 72 that connects adjacent solar cell elements 70 with each other. The tab wiring 72 is an elongated metallic foil, and, for example, a copper foil coated with silver is used. An end of the tab wiring 72 is connected to a first metal electrode 20 of a solar cell element 70, and the other end thereof is connected to a second metal electrode 30 of another solar cell element 70 that is connected to the solar cell element 70.

The solar cell module 100 is provided with a protection substrate 40, a back sheet 50, a first sealing layer 42, and a second sealing layer 44. The protection substrate 40 and the back sheet 50 protect the solar cell element 70 from the external environment. Also, the protection substrate 40 that is provided on the side of the light-receiving surface 70a transmits light having a wavelength band that is absorbed by the solar cell element 70 for the generation of electricity. The protection substrate 40 is, for example, a glass substrate. The back sheet 50 is a resin substrate of EVA, polyimides, or the like or a glass substrate as in the case of the protection substrate 40.

The first sealing layer 42 and the second sealing layer 44 are resin materials such as EVA, polyamides, or the like. This prevents, e.g., the infiltration of moisture to the electricity generation layer of the solar cell module 100 and also improves the overall strength of the solar cell module 100.

A white resin material in which particles of titania or the like are dispersed may be used for the second sealing layer 44 on the side of the back surface 70b. This allows light that has passed through the solar cell element 70 and reached the second sealing layer 44 to be scattered so that the light heads to the solar cell element 70 again.

As shown in FIG. 2, the first metal electrode 20 is provided with a plurality of finger electrodes 21 extending parallel to one another and three bus bar electrodes 22 extending perpendicularly to the finger electrodes 21. The finger electrodes 21 are formed on the valid area C2. Thus, the finger electrodes 21 are desirably formed thinly so that light entering the electricity generation layer 10 is not blocked.

The bus bar electrodes 22 connect the plurality of finger electrodes 21 with one another. The bus bar electrodes 22 need to be formed thin enough not to block light entering the electricity generation layer 10 and thick enough to allow the electricity collected from the plurality of finger electrodes 21 to flow efficiently.

In the same way as in the first metal electrode 20, the second metal electrode 30 is also provided with a plurality of finger electrodes extending parallel to one another and three bus bar electrodes extending perpendicularly to the finger electrodes. Since the back surface 70b is not a principle surface on which sunlight mainly becomes incident, the electricity collection efficiency may be increased by increasing the number of finger electrodes on the side of the back surface 70b than that on the side of the light-receiving surface 70a.

Figure 3:
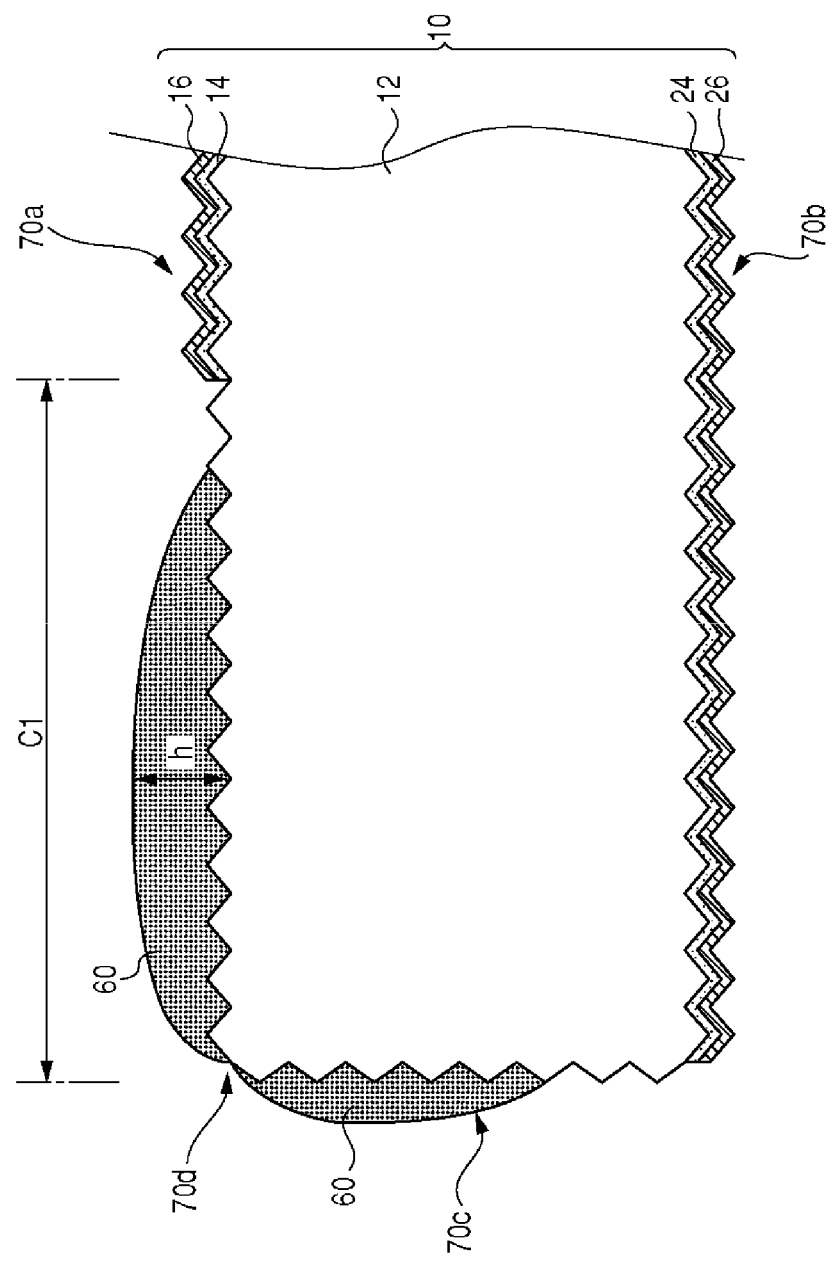
FIG. 3 is a cross-sectional view illustrating a light diffusion portion according to the embodiment of the present invention.

FIG. 3 is a cross-sectional view illustrating the light diffusion portion 60. The light diffusion portion 60 is formed of a material having light diffusivity with respect to light having a wavelength that is absorbed by the solar cell element 70. For example, a white material in which particles of titania ($TiO_2$), alumina ($Al_2O_3$), or the like are dispersed in a resin substrate such as an epoxy resin, an acrylic resin, or the like is used. The light diffusion portion 60 needs to have a height h that is enough to be able to sufficiently scatter incident light. The height h may be set to be 3 μm or more and 100 μm or less.

The light diffusion portion 60 is formed to have a convex surface shape with a gentle curvature where the light diffusion portion 60 is raised in relation to the light-receiving surface 70a so as to be able to effectively scatter incident light that is heading to the outer peripheral area C1. The light diffusion portion 60 is formed to cover at least a part of a side surface 70c so as to be able to scatter incident light that is heading to the side surface 70c of the solar cell element 70. By providing the light diffusion portion 60 on both the light-receiving surface 70a and the side surface 70c, a curved surface having various inclinations with respect to incident light can be formed. Thus, light that is incident on the light diffusion portion 60 can be effectively scattered. The light diffusion portion 60 is formed such that the light diffusion portion 60 avoids a corner 70d formed by the light-receiving surface 70a and the side surface 70c. By forming the light diffusion portion 60 while avoiding the corner 70d, the amount of a resin material that is necessary for the formation of the light diffusion portion 60 can be reduced compared to a case where the light diffusion portion 60 is provided while covering the corner 70d.

Figure 4:
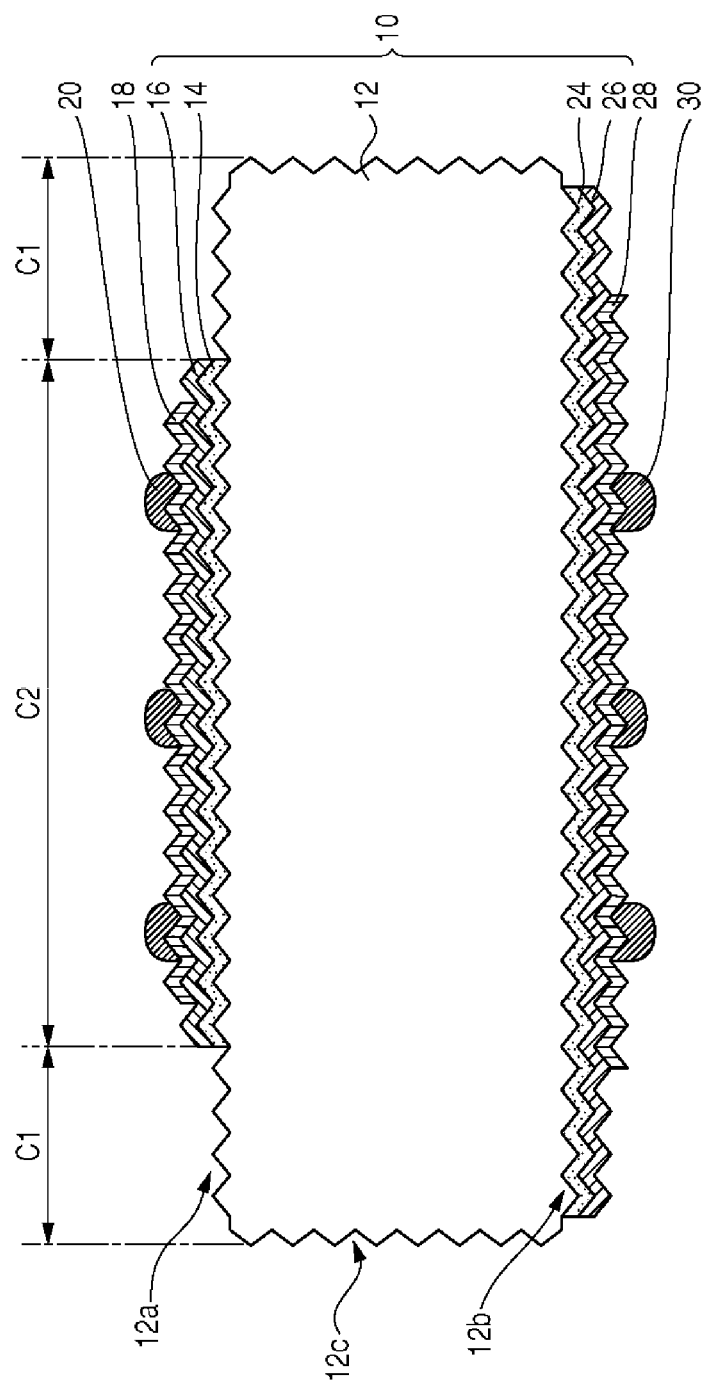
FIG. 4 is a diagram illustrating the solar cell element on which electrodes are formed according to the embodiment of the present invention.

An explanation will be given now regarding the manufacturing method of the solar cell module 100. FIG. 4 is a diagram illustrating the solar cell element 70 on which electrodes are formed. The base substrate 12 is of a crystalline semiconductor material and is, for example, a semiconductor substrate of silicon, polycrystalline silicon, gallium arsenide (GaAs), indium phosphide (InP), or the like. In the present embodiment, an example is shown where a monocrystalline silicon substrate is used as the base substrate 12. Therefore, the first i-type layer 14, the first conductivity type layer 16, the second i-type layer 24, and the second conductivity type layer 26, which are described later, are also assumed to be silicon layers. However, the base substrate 12 may be of a material other than silicon, and these layers may be of a material other than a silicon layer.

A texture structure is formed on a first surface 12a, a second surface 12b, and a side surface 12c of the base substrate 12. The first i-type layer 14 and the first conductivity type layer 16 are formed in order on the first surface 12a of the base substrate 12, and the second i-type layer 24 and the second conductivity type layer 26 are formed in order on the second surface 12b. Thereby, the electricity generation layer 10 can be formed.

The first i-type layer 14 and the first conductivity type layer 16 can be formed by plasma-enhanced chemical vapor deposition (PECVD) where a silicon-containing gas such as silane ($SiH_4$) or the like is used. A dopant-containing gas such as diborane ($B_2H_6$) or the like is mixed in a raw material gas as necessary.

In the same way, the second i-type layer 24 and the second conductivity type layer 26 can be also formed by plasma-enhanced chemical vapor deposition (PECVD) where a silicon-containing gas such as silane ($SiH_4$) or the like is used. A dopant-containing gas such as phosphine ($PH_3$) or the like is mixed in a raw material gas as necessary.

By forming the first i-type layer 14 and the first conductivity type layer 16 while placing a mask provided with an opening that corresponds to the outer peripheral area C1 on the first surface 12a, the first i-type layer 14 and the first conductivity type layer 16 are formed in the valid area C2, which is an area that is inside only by a given distance. Thereby, the intrusion and attachment of both the pair of the first i-type layer 14 and the first conductivity type layer 16 and the pair of the second i-type layer 24 and the second conductivity type layer 26 on the side surface 12c can be prevented, and the generation of a short-circuit state caused due to the contact of the pairs with each other can be prevented in a process of forming the electricity generation layer 10.

The first transparent electrode layer 18 and the first metal electrode 20 are formed on the first conductivity type layer 16, and the second transparent electrode layer 28 and the second metal electrode 30 are formed on the second conductivity type layer 26. The first transparent electrode layer 18 and the second transparent electrode layer 28 can be formed by a thin film formation method such as a sputtering method or plasma-enhanced chemical vapor deposition (PECVD). The first metal electrode 20 and the second metal electrode 30 can be formed by printing a conductive material such as silver (Ag) paste or the like by screen printing.

Figure 5:
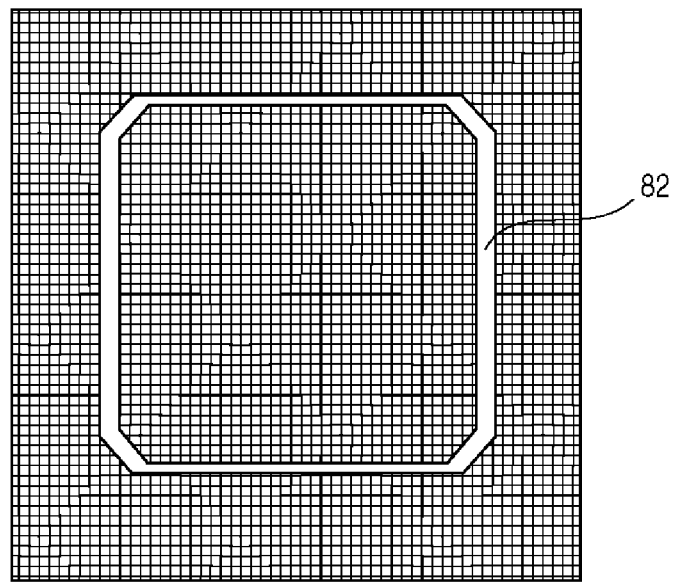
FIG. 5 is a diagram illustrating a printing plate that is used for the application of a light diffusion portion according to the embodiment of the present invention.

FIG. 5 is a diagram schematically illustrating a printing plate 80 used for the application of a light diffusion portion 60. The printing plate 80 has a pattern 82 that corresponds to the outer peripheral area C1 of the light-receiving surface 70a and forms the light diffusion portion 60 by printing a coating that has light diffusivity via this printing plate 80. Offset printing is used as a printing method. Offset printing includes intaglio offset printing, lithographic offset printing, and the like, and the shape of a printing plate includes a planar shape, a circular cylindrical shape, and the like. An explanation will be made regarding a case where intaglio offset printing is performed using an intaglio printing plate having a planar shape in the present embodiment. In this case, a concave portion is provided on the printing plate 80 as the pattern 82 that corresponds to the outer peripheral area C1. By transferring the coating embedded in this concave portion to a circular cylindrical blanket, the coating transferred to the blanket is applied to the outer peripheral area C1 on the light-receiving surface 70a.

Figure 6:
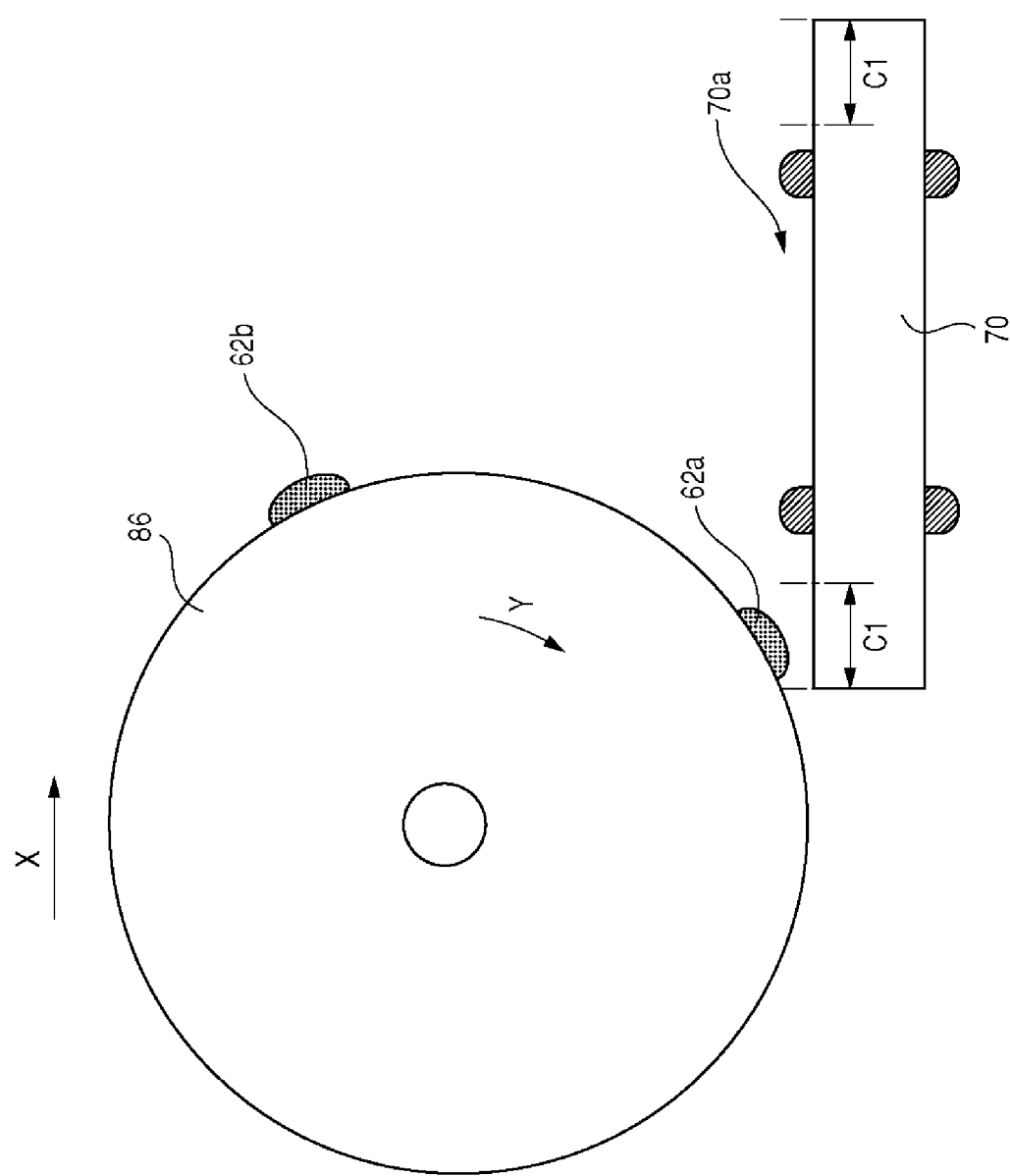
FIG. 6 is a diagram illustrating a process of applying a light diffusion portion by offset printing according to the embodiment of the present invention.
Figure 7:
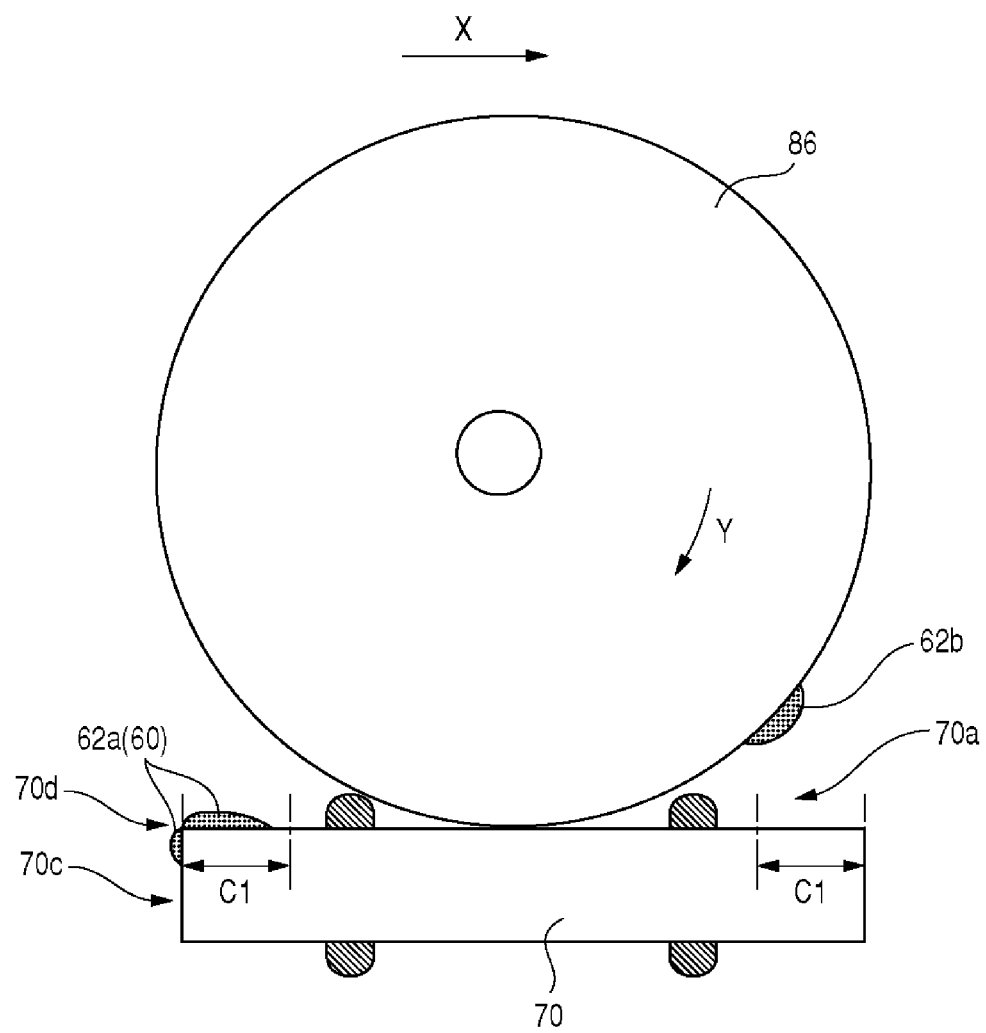
FIG. 7 is a diagram illustrating a process of applying a light diffusion portion according to the embodiment of the present invention by offset printing.

FIGS. 6 and 7 are diagrams illustrating a process of applying the light diffusion portion 60 by offset printing. On a circular cylindrical blanket 86 shown in FIG. 6, coatings 62a and 62b are transferred at respective positions that correspond to the concave portion of the printing plate 80 having the pattern 82. By rotating the blanket 86 in a Y direction while moving the blanket 86 in an X direction as shown in FIG. 7 from a state shown in FIG. 6, the coating 62a transferred to the blanket 86 is applied to the outer peripheral area C1 on the light-receiving surface 70a. Also, by rotating the blanket 86 in the Y direction while moving the blanket 86 in the X direction from a state shown in FIG. 7, the coating 62b is applied to the outer peripheral area C1 on the light-receiving surface 70a.

The coating 62a applied to the outer peripheral area C1 is raised to form a convex surface with a gentle curvature due to the surface tension thereof. By hardening the coating 62a in this state, a light diffusion portion 60 having a gentle curvature is formed. For example, a white coating in which particles of titania, alumina, or the like are dispersed in a resin substrate such as an epoxy resin, an acrylic resin, or the like may be used as a coating that has such surface tension. In the case of using an acrylic resin, a material having flexibility such as urethane may be combined in order to relax stress after a coating 62 is hardened.

The coating 62a applied to the outer peripheral area C1 is also applied, as well as on the light-receiving surface 70a, on the side surface 70c such that the coating 62a covers at least a portion of the side surface 70c. In order to apply the coating as described above, the pattern of the concave portion formed on the printing plate 80 needs to be a little wider outwardly than the shape of the outer peripheral area C1. The amount of a coating to be applied may be increased by deepening the depth of the concave portion of the printing plate 80 so as to apply the coating such that the coating sticks out from the outer peripheral area C1.

Figure 8:
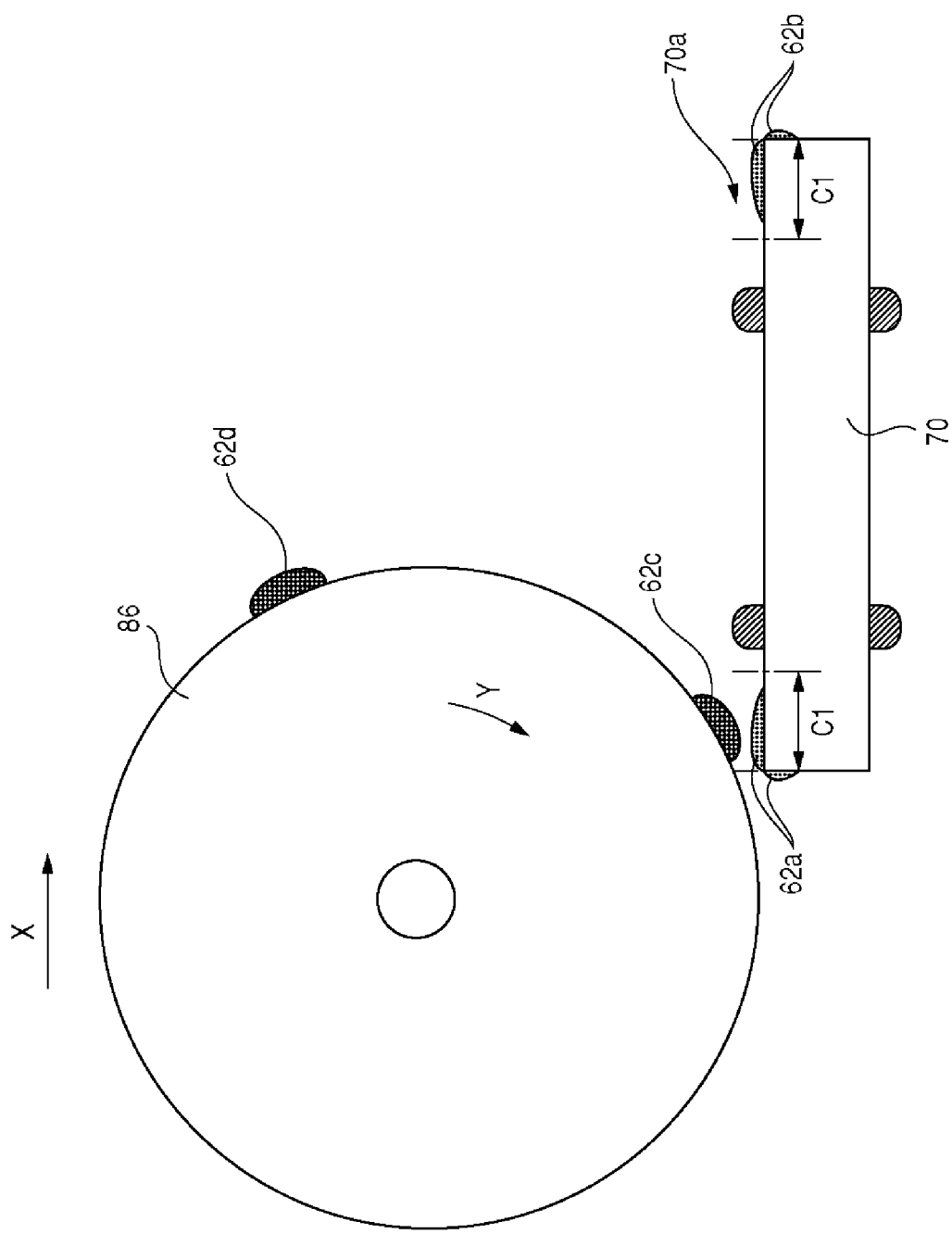
FIG. 8 is a diagram illustrating a process of applying a light diffusion portion in a superposed manner by offset printing according to the embodiment of the present invention.
Figure 9:
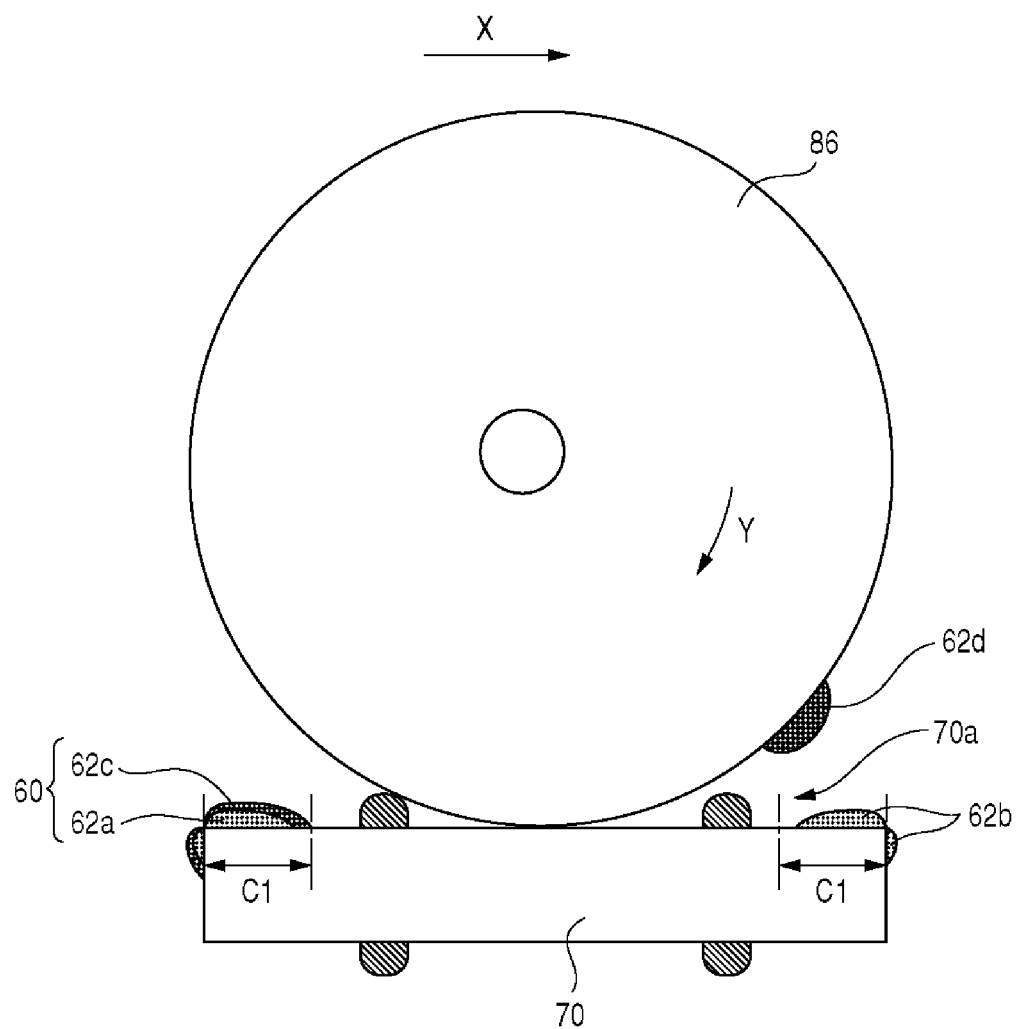
FIG. 9 is a diagram illustrating a process of applying a light diffusion portion in a superposed manner by offset printing according to the embodiment of the present invention.

FIGS. 8 and 9 are diagrams illustrating a process of applying the light diffusion portion 60 in a superposed manner by offset printing. As shown in FIG. 8, by applying coatings 62c and 62d over the coatings 62a and 62b applied by the first offset printing on the outer peripheral area C1 by performing offset printing once again, application of the coatings in a superposed manner is performed. In this case, as shown in FIG. 9, a state is obtained where the coating 62c applied in the second offset printing is superposed on the coating 62a applied in the first offset printing. As described, by repeating the printing process twice, the height of the light diffusion portion 60 can be increased, and the light diffusivity can be increased. For example, by applying a coating having a height of 10 μm by first offset printing, a light diffusion portion 60 having a height of 20 μm can be formed by a second printing process.

The printing process may be repeated three or more times according to the amount of a coating that can be preferably applied by single printing and the height of the light diffusion portion 60 that is required. After a coating applied in the first printing is once hardened, a coating for second or any subsequent printing may be applied. Also, the type of particles that are contained in a coating and that have light diffusivity and the type of a resin that serves as a substrate may be changed between a coating that is applied in the first printing and a coating that is applied in the second or any subsequent printing, and a material blend ratio may be also changed therebetween.

Figure 10:
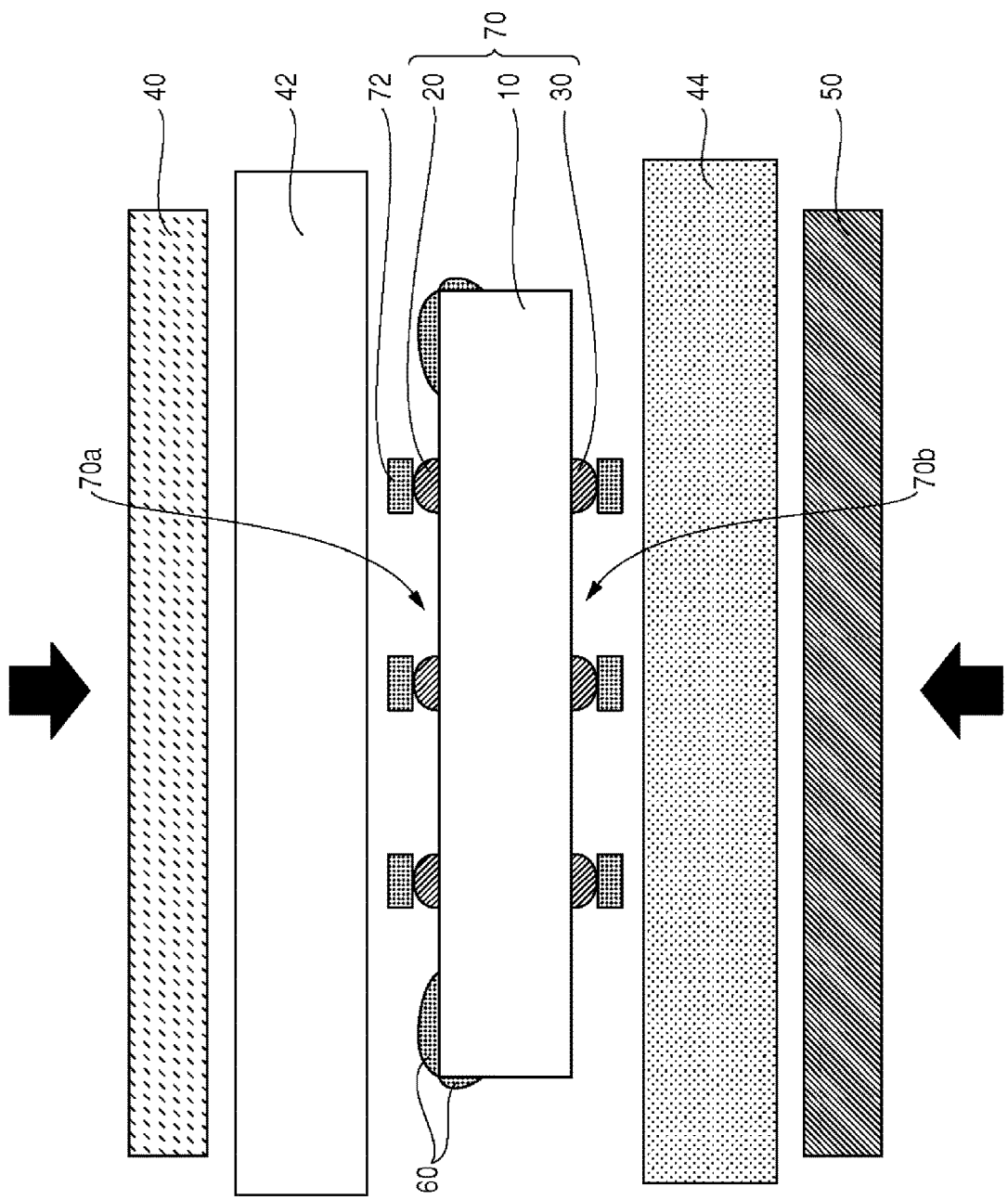
FIG. 10 is a diagram illustrating a process of laminating a solar cell element with a protection substrate and a back sheet according to the embodiment of the present invention.

FIG. 10 is a diagram illustrating a process of laminating the solar cell element 70 with a protection substrate 40 and a back sheet 50. After the solar cell element 70 on which the light diffusion portion 60 is formed is connected by the tab wiring 72, the first sealing layer 42 and the protection substrate 40 are placed on the side of the light-receiving surface 70a, and the second sealing layer 44 and the back sheet 50 are placed on the back surface 70b. The solar cell element 70 is then thermocompression-bonded while the solar cell element 70 is sandwiched between the protection substrate 40 and the back sheet 50. This allows the first sealing layer 42 and the second sealing layer 44 to be fused, forming the solar cell module 100 shown in FIG. 1.

Figure 11:
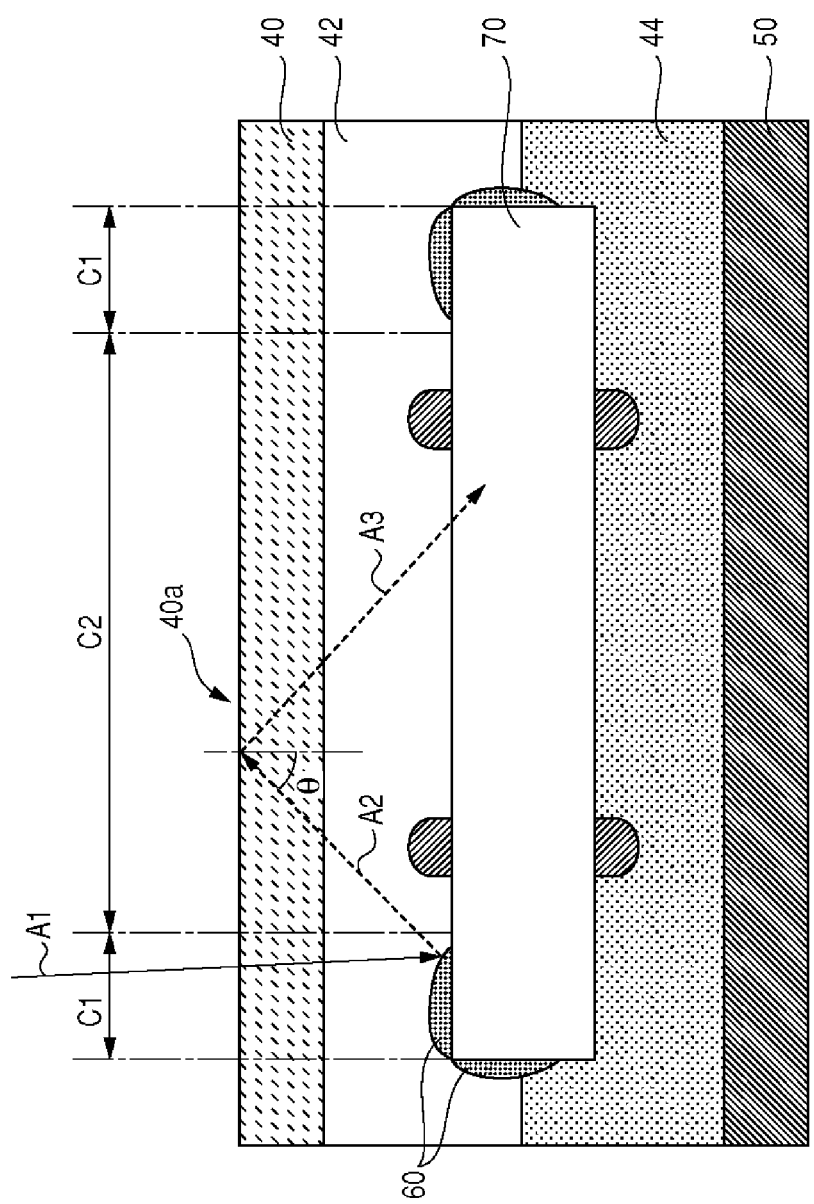
FIG. 11 is a diagram schematically illustrating a state where incident light is scattered by a light diffusion portion according to the embodiment of the present invention.

FIG. 11 is a diagram schematically illustrating a state where incident light is scattered by a light diffusion portion 60. Incident light A1 that enters through the protection substrate 40 reaches the light diffusion portion 60 after passing through the protection substrate 40 and the first sealing layer 42, then becomes scattered by the light diffusion portion 60, and heads toward the protection substrate 40. If the incident angle θ of scattered light A2 with respect to an upper surface 40a of the protection substrate 40 is a critical angle or larger, the scattered light A2 is totally reflected at the protection substrate 40 at this time. Thus, reflected light A3 can be directed to the valid area C2 of the solar cell element 70.

The light diffusion portion 60 according to the present embodiment is formed to form a convex surface with a gentle curvature and is thus capable of scattering incident light, which is heading to the outer peripheral area C1, in a direction different from that of the incident light, compared to a case where a light diffusion portion is provided flatly on the light-receiving surface 70a. Thereby, more scattered light A2 can be totally reflected at the upper surface 40a and directed to the valid area C2 of the solar cell element 70, and the utilization efficiency of the incident light can be increased.

The light diffusion portion 60 according to the present embodiment can be manufactured by a process of printing a coating. Thus, the light diffusion portion 60 having a convex surface can be formed easily and inexpensively compared to a case where a sheet having light diffusivity is pasted. In the present embodiment, the light diffusion portion 60 is formed such that the light diffusion portion 60 covers the entire surface of the outer peripheral area C1. However, the light diffusion portion 60 may be formed only on a portion of the outer peripheral area C1.

Second Embodiment

A solar cell module 100 according to a second embodiment has a structure that is the same as that according to the first embodiment shown in FIG. 1. However, the solar cell module 100 is different in that a light diffusion portion 60 is formed by screen printing. An explanation will be given in the following mainly regarding differences from the first embodiment.

Figure 12:
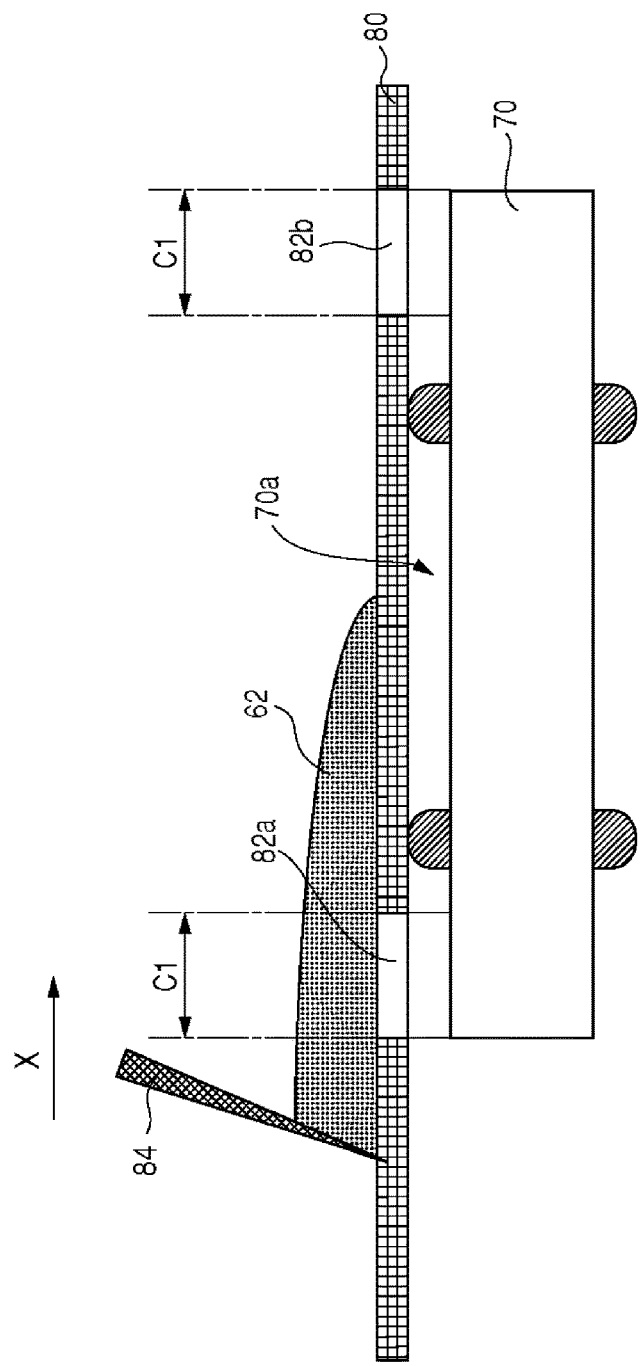
FIG. 12 is a diagram illustrating a process of applying a light diffusion portion by screen printing according to the embodiment of the present invention.
Figure 13:
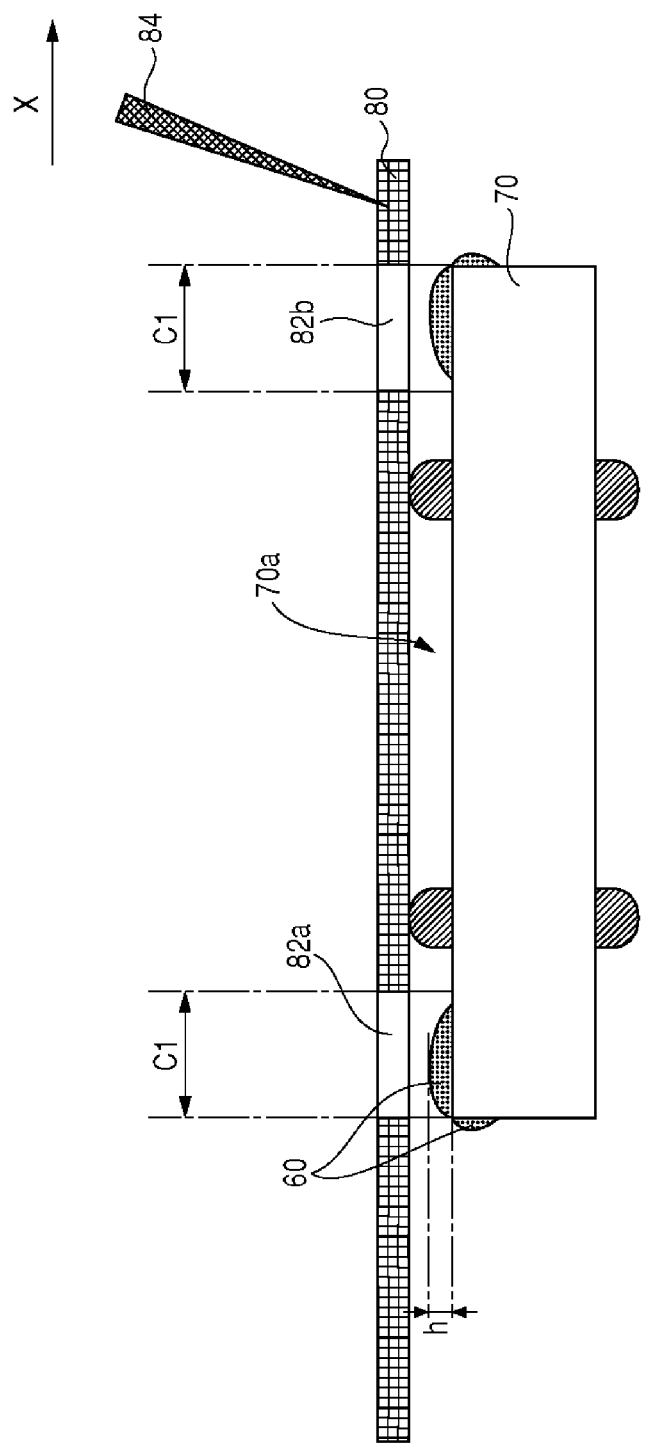
FIG. 13 is a diagram illustrating a process of applying a light diffusion portion by screen printing according to the embodiment of the present invention.

FIGS. 12 and 13 are diagrams illustrating a process of applying a light diffusion portion 60 by screen printing. As shown in FIG. 12, a printing plate 80 having openings 82a and 82b of a pattern that correspond to an outer peripheral area C1 is placed on a light-receiving surface 70a of a solar cell element 70, and a coating 62 is put on the printing plate 80. Then, by moving a squeegee 84 in an X direction as shown in FIG. 13 from a state shown in FIG. 12, the coating 62 is applied to the outer peripheral area C1 via the openings 82a and 82b. The coating applied to the outer peripheral area C1 is raised to form a convex surface with a gentle curvature due to the surface tension thereof at this time. By hardening the coating in this state, a light diffusion portion 60 having a gentle convex surface is formed.

By applying the light diffusion portion 60 by screen printing, the amount of the coating that can be applied by single printing can be increased, and the height of the light diffusion portion 60 can be increased compared to the case of offset printing. By changing the height of the openings of the printing plate 80 and conditions such as the viscosity of the coating and the like, the height of the light diffusion portion 60 can be increased, and the light diffusivity can be increased. The height of the light diffusion portion 60 can be also thickened by repeating the printing process twice or more in the screen printing.

Third Embodiment

Figure 14:
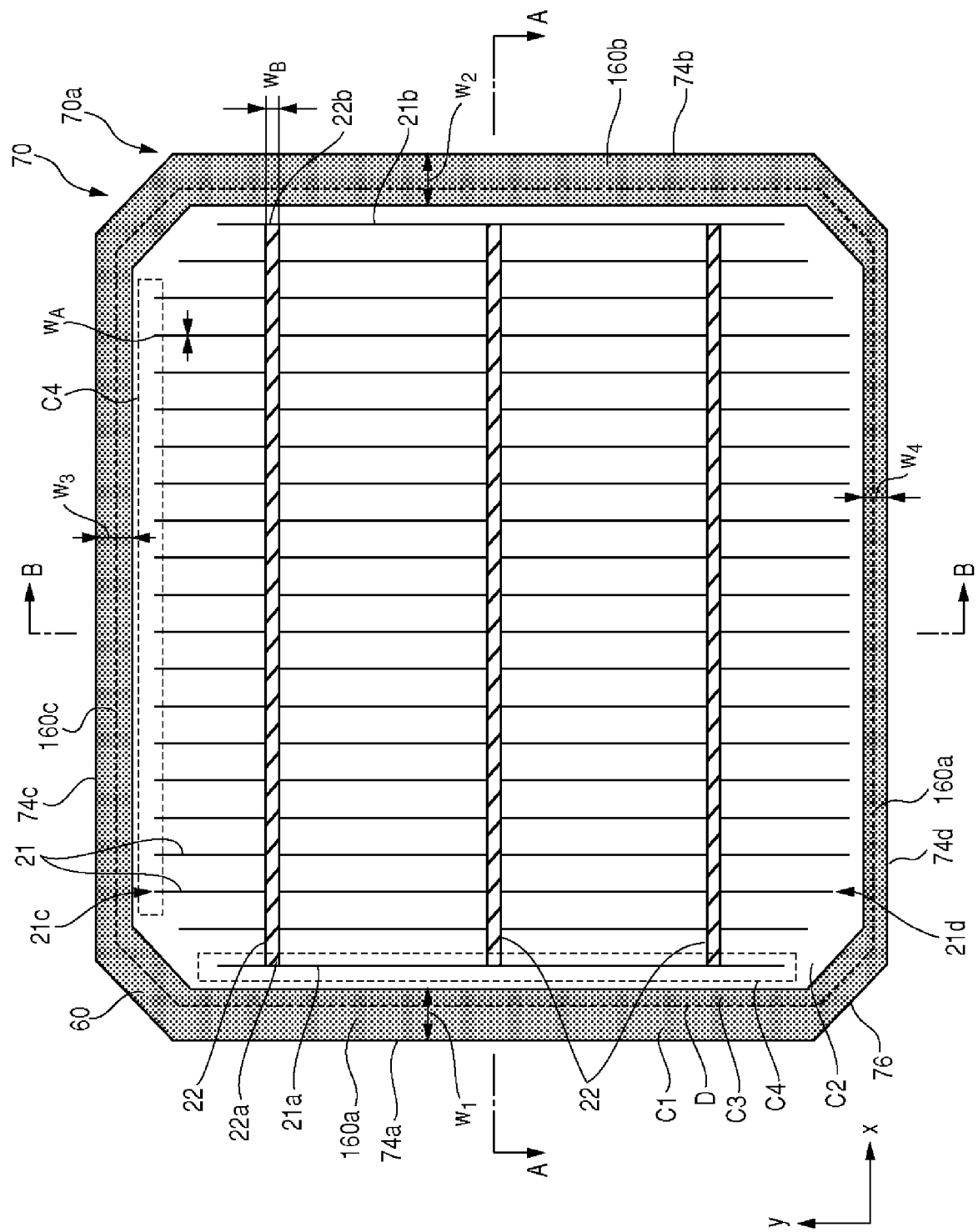
FIG. 14 is a diagram illustrating the solar cell element according to the embodiment of the present invention.

FIG. 14 is a diagram illustrating a solar cell element 70 according to a third embodiment. A solar cell module according to a third embodiment has a structure that is the same as that according to the first embodiment shown in FIG. 1. However, the solar cell module is different in that widths $w_1$ through $w_4$ in a short-side direction of a light diffusion portion 60 vary depending on the arrangement of bus bar electrodes 22 and the structure of an electricity generation layer that constitutes the solar cell element 70. In the present embodiment, the light diffusion portion 60 is also provided in a boundary area C3 adjacent to an outer peripheral area C1 in a valid area C2. Light that is incident and scattered on the light diffusion portion 60 mainly enters an adjacent area C4 located just inside the boundary area C3, contributing the generation of electricity. An explanation will be given in the following mainly regarding differences from the first embodiment.

A light-receiving surface 70a has an octagonal shape formed by four long sides 74a through 74d and four short sides 76. In the following, the four long sides 74a through 74d are also referred to as a left side 74a, a right side 74b, an upper side 74c, and a lower side 74d, respectively, for the sake of ease of explanation. The left side 74a and the right side 74b are long sides that extend parallel to finger electrodes 21 and that extend in a direction (y direction) that is perpendicular to the bus bar electrodes 22. The upper side 74c and the lower side 74d are long sides that extend parallel to the bus bar electrodes 22 and that extend in a direction (x direction) that is perpendicular to the finger electrodes 21.

The finger electrodes 21 are formed on the valid area C2 and distributed throughout substantially the entire surface of the valid area C2 such that the finger electrodes 21 can efficiently collect electricity generated in the valid area C2. In the plurality of finger electrodes 21 that are provided parallel to one another, a finger electrode 21a on the extreme left is provided near the left side 74a, and a finger electrode 21b on the extreme right is provided near the right side 74b. An upper end portion 21c of a finger electrode 21 extending in the y direction is provided near the upper side 74c, and a lower end portion 21d of a finger electrode 21 is provided near the lower side 74d.

The finger electrodes 21 are formed on the valid area C2. Thus, the finger electrodes 21 are desirably formed thinly so that light entering the electricity generation layer 10 is not blocked. For example, the width $w_A$ of the finger electrodes 21 in a short-side direction may be set to be around 80 μm.

The bus bar electrodes 22 are provided extending in the x direction from the finger electrode 21a on the extreme left to the finger electrode 21b on the extreme right so as to connect each of the plurality of parallel finger electrodes 21. Therefore, a left end portion 22a of a bus bar electrode 22 is provided near the left side 74a, and a right end portion 22b of a bus bar electrode 22 is provided near the right side 74b.

The bus bar electrodes 22 need to be formed thin enough not to block light entering the electricity generation layer 10 and thick enough to allow the electricity collected from the plurality of finger electrodes 21 to flow efficiently. For example, the width $w_B$ of the bus bar electrodes 22 in a short-side direction may be set to be around 100 μm.

The light diffusion portion 60 is formed of a material having light diffusivity with respect to light having a wavelength that is absorbed by the solar cell element 70. Having light diffusivity means to have the property of reflecting light that is incident on the light diffusion portion 60 mainly by diffuse reflection instead of specular reflection. The light diffusion portion 60 is formed of a material having an electrical insulation property. For example, an insulating white material in which particles of titania ($TiO_2$), alumina ($Al_2O_3$), or the like are dispersed in a resin substrate such as an epoxy resin, an acrylic resin, or the like is used as the light diffusion portion 60 having such a property. Therefore, the light diffusion portion 60 has electrical conductivity that is lower than that of the finger electrodes 21 and the bus bar electrodes 22 and has light diffusivity that is higher than that of the finger electrodes 21 and the bus bar electrodes 22.

The light diffusion portion 60 is provided along the long sides 74 and the short sides 76 such that the light diffusion portion 60 covers the entire surface of the outer peripheral area C1 on the light-receiving surface 70a. The light diffusion portion 60 is formed such that the widths $w_1$ through $w_4$ in a short-side direction that are perpendicular to the long sides 74 or the short sides 76 are larger than the width $w_A$ of the finger electrodes 21 and the width $w_B$ of the bus bar electrodes 22 so as to allow light that is heading to the outer peripheral area C1 to efficiently enter the valid area C2. For example, the light diffusion portion 60 is provided so that the widths $w_1$ through $w_4$ in the short-side direction become 200 μm or more.

The light diffusion portion 60 has first light diffusion portions 160a and 160b provided along the left side 74a and the right side 74b, respectively, and second light diffusion portions 160c and 160d provided along the upper side 74c and the lower side 74d, respectively. The first light diffusion portions 160a and 160b are formed such that the respective widths thereof in a short direction become larger than the respective widths of the second light diffusion portions 160c and 160d. For example, the first light diffusion portions 160a and 160b may be provided so that the respective widths $w_1$ and $w_2$ thereof become 1 mm or more and specifically around 1.2 mm.

On the other hand, the second light diffusion portions 160c and 160d are formed such that the respective widths thereof in a short direction become smaller than the respective widths of the first light diffusion portions 160a and 160b. For example, the second light diffusion portions 160c and 160d are provided such that the widths $w_3$ and $w_4$ thereof are 200 μm or more and 1 mm or less. More specifically, the second light diffusion portion 160c corresponding to the upper side 74c is provided such that the width $w_3$ thereof is around 900 μm, and the second light diffusion portion 160d is provided such that the width $w_4$ thereof is around 300 μm.

Figure 15:
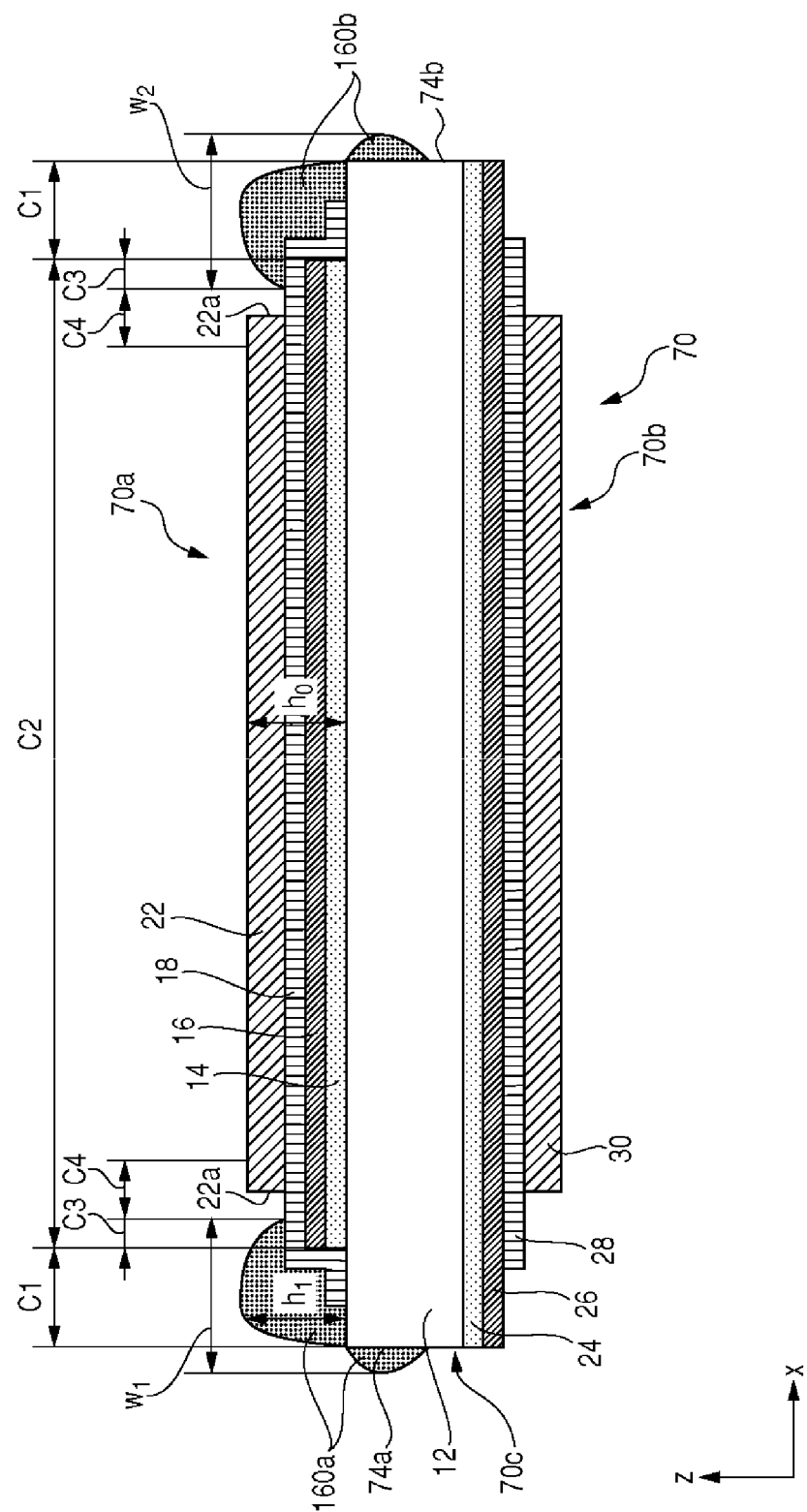
FIG. 15 is a cross-sectional view illustrating a first light diffusion portion according to the embodiment of the present invention.
Figure 16:
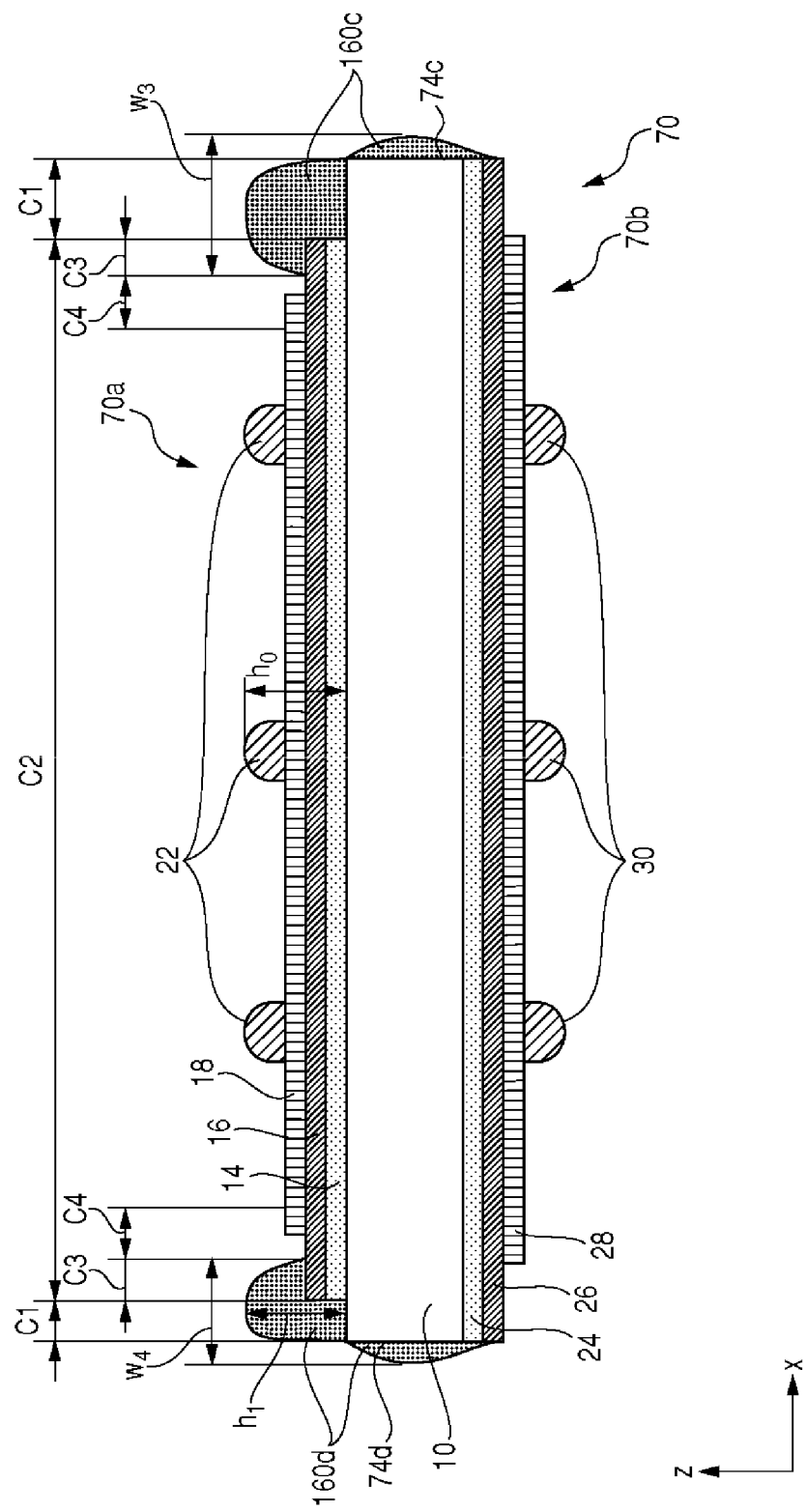
FIG. 16 is a cross-sectional view illustrating a second light diffusion portion according to the embodiment of the present invention.

FIG. 15 is a cross-sectional view illustrating the first light diffusion portions 160a and 160b and is a diagram illustrating a cross-sectional view of FIG. 14 taken along line A-A. The structure of a solar cell element 70 according to the present embodiment will be shown before an explanation is given regarding the light diffusion portions. In the first embodiment, the first transparent electrode layer 18 is provided in the area inside the valid area C2 in which the first i-type layer 14 and the first conductivity type layer 16 are formed. In the present embodiment, a solar cell element 70 is used where an area in which the first transparent electrode layer 18 is provided varies depending on a cross-sectional direction. As shown in FIG. 15, the first transparent electrode layer 18 is also formed on the outer peripheral area C1 with respect to an x direction. With respect to a y direction, the first transparent electrode layer 18 is formed inside the valid area C2 as shown in FIG. 16 described later.

The first light diffusion portions 160a and 160b are provided on the light-receiving surface 70a of the solar cell element 70 and are also provided to cover the upper half area of the side surface 70c on the side of the light-receiving surface 70a. The first light diffusion portions 160a and 160b are provided such that the height $h_1$ thereof is about the same as the height $h_0$ of the bus bar electrodes 22 or a little shorter than the height $h_0$. For example, the height $h_1$ of the first light diffusion portions 160a and 160b may be set to be around 20 μm to 30 μm.

The first light diffusion portions 160a and 160b are provided on the outer peripheral area C1 in which the first conductivity type layer 16 is not provided and are also provided on the boundary area C3, in the valid area C2 in which the first conductivity type layer 16 is provided, that is adjacent to the outer peripheral area C1. A distance to the finger electrodes 21 or the bus bar electrodes 22 is farther from the boundary area C3 than from the central part of the valid area C2. Thus, the boundary area C3 is an area that is low in electricity collection efficiency and is thus unlikely to contribute to the generation of electricity. The light diffusion portion 60 is desirably provided if the efficiency of the generation of electricity is increased when the light diffusion portion 60 is provided and incident light is directed to an adjacent area C4, which is a partial area of the valid area C2, compared to when light is allowed to enter directly without any light diffusion portion 60 provided, in such an area that is unlikely to contribute to the generation of electricity.

Light that becomes incident on the light diffusion portion 60 and then diffused rarely becomes incident again on the central part of the light-receiving surface 70a and mainly becomes incident on an adjacent area C4 close to the light diffusion portion 60. Therefore, if the electricity generation contribution rate of the adjacent area C4 is high, the utilization efficiency of light that is diffused by the light diffusion portion 60 and that becomes incident again becomes high. On the other hand, if the electricity generation contribution rate of the adjacent area C4 is low, the efficiency of the generation of electricity does not become increased so much even when the light diffusion portion 60 is provided.

An adjacent area C4 corresponding to the left side 74a has relatively high electricity collection efficiency since the adjacent area C4 is an area that is close to the left end portion 22a of the bus bar electrodes 22 and is an area with a electricity generation contribution rate that is higher than that of an adjacent area corresponding to the upper side 74c or the lower side 74d. In the same way, an adjacent area C4 corresponding to the right side 74b also has an electricity generation contribution rate. Therefore, by increasing the respective widths $w_1$ and $w_2$ of the first light diffusion portions 160a and 160b, light that is incident on the outer peripheral area C1 and the boundary area C3 can be directed to an adjacent area C4 having a high electricity generation contribution rate in the left side 74a and the right side 74b. In other words, by increasing the respective widths $w_1$ and $w_2$ of the first light diffusion portions 160a and 160b, the efficiency of the generation of electricity can be increased in the left side 74a and the right side 74b.

FIG. 16 is a cross-sectional view illustrating the second light diffusion portions 160c and 160d and is a diagram illustrating a cross-sectional view of FIG. 14 taken along line B-B. The second light diffusion portions 160c and 160d are provided on the light-receiving surface 70a of the solar cell element 70 and are also provided to cover substantially the entire respective surfaces of the side surfaces 70c corresponding to the upper side 74c and the lower side 74d. Therefore, the second light diffusion portions 160c and 160d are provided to cover not only the upper half area of the side surface 70c on the side of the light-receiving surface 70a but also the lower half area thereof on the side of the back surface 70b. The second light diffusion portions 160c and 160d are provided such that the height $h_1$ thereof is about the same as the height $h_0$ of the bus bar electrodes 22 or a little shorter than the height $h_0$. For example, the height $h_1$ of the second light diffusion portions 160c and 160d may be set to be around 20 μm to 30 μm.

In the same way, the second light diffusion portions 160c and 160d are provided on the outer peripheral area C1 in which the first conductivity type layer 16 is not provided and are also provided in the boundary area C3, in the valid area C2 in which the first conductivity type layer 16 is provided, that is adjacent to the outer peripheral area C1. Since adjacent areas C4 corresponding to the upper side 74c and the lower side 74d on which the second light diffusion portions 160c and 160d are provided are relatively far away in distance from the bus bar electrodes 22 to which the tab wiring is connected and thus have electricity collection efficiency that is lower than that of adjacent areas C4 corresponding to the left side 74a and the right side 74b. In such areas, even when the light diffusion portion 60 is provided, light becomes incident again on the adjacent areas C4 having a low electricity generation contribution rate. Thus, the efficiency of the generation of electricity can be more easily increased when an area in which the light diffusion portion 60 is provided is reduced so as to allow light to enter directly. By decreasing the respective widths $w_3$ and $w_4$ of the second light diffusion portions 160c and 160d, an area of the valid area C2 that is covered by the second light diffusion portions 160c and 160d is reduced in the upper side 74c and the lower side 74d. This allows light that is mainly incident on the outer peripheral area C1 to be directed to the valid area C2 so as to increase the efficiency of the generation of electricity.

In the solar cell element 70 according to the present embodiment, positions at which the first i-type layer 14 and the first conductivity type layer 16 are provided are located toward the lower side 74d, and a width of the outer peripheral area C1 that corresponds to the lower side 74d is smaller than a width of the outer peripheral area C1 that corresponds to the upper side 74c. Thus, in the present embodiment, the width $w_4$ of the second light diffusion portion 160d corresponding to the lower side 74d on which the width of the outer peripheral area C1 is smaller is set to be relatively small, and the width $w_3$ of the second light diffusion portion 160c corresponding to the upper side 74c is set to be relatively large. In other words, the respective widths of the second light diffusion portions 160c and 160d in a short direction are changed according to a width of the outer peripheral area C1, in other words, according to the position of the valid area C2 contributing to the generation of electricity. By changing the respective widths of the second light diffusion portions 160c and 160d according to the outer peripheral area C1 and the position of the valid area C2 as described above, the efficiency of the generation of electricity can be increased.

An explanation will be given now regarding the manufacturing method of a solar cell module according to a third embodiment. In the present embodiment, a light diffusion portion 60 is formed by screen printing in the same way as in the second embodiment. An explanation will be first given regarding a process of forming the light diffusion portion 60.

Figure 17:
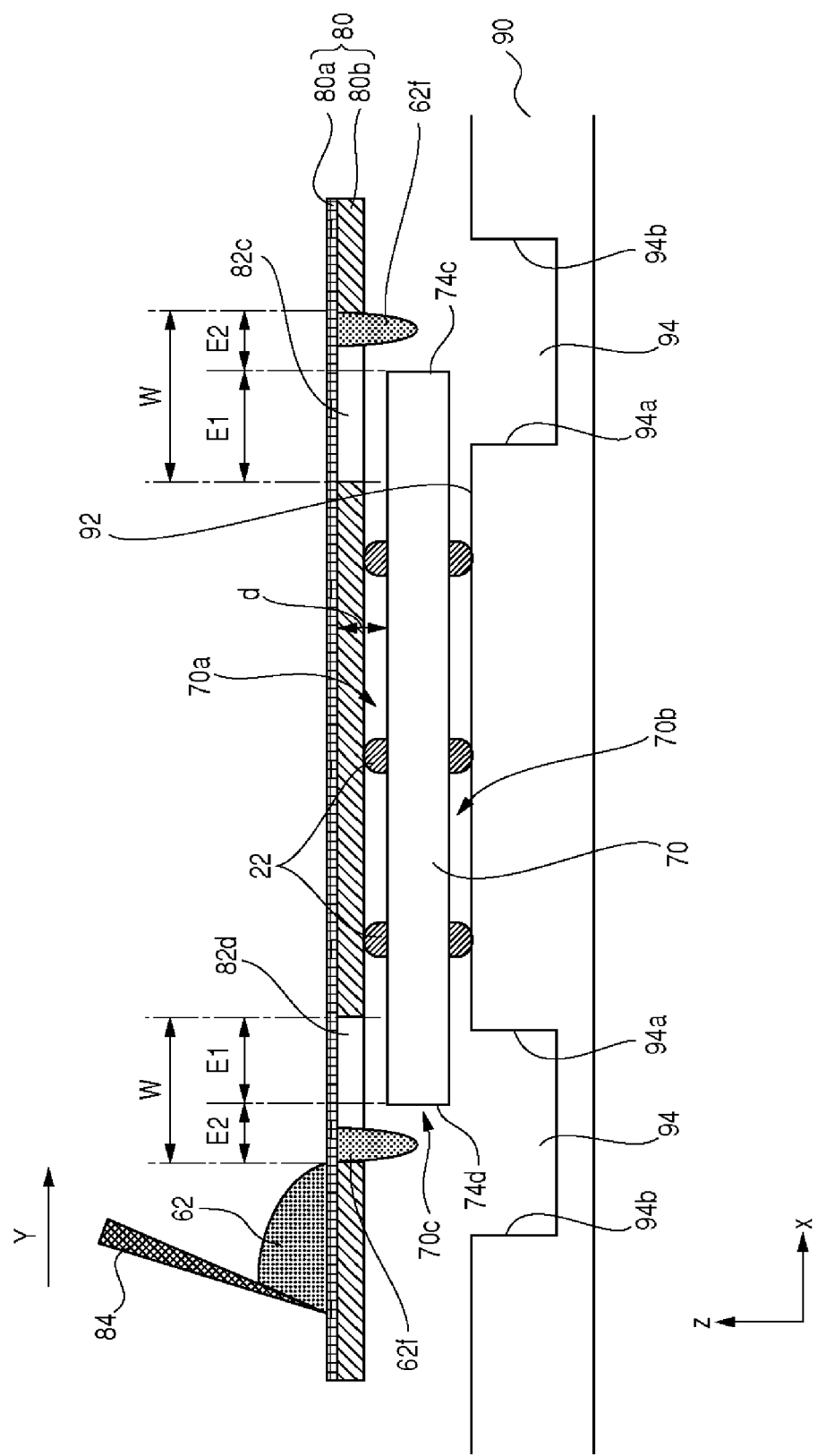
FIG. 17 is a diagram illustrating a process of applying a light diffusion portion by screen printing according to the embodiment of the present invention.

FIG. 17 is a diagram illustrating a process of applying a light diffusion portion 60 by screen printing according to the third embodiment. The solar cell element 70 is placed on a stage 90 on which grooves 94 are provided. Then, the printing plate 80 having the openings 82c and 82d is placed on the light-receiving surface 70a of the solar cell element 70, and the squeegee 84 is moved in a Y direction. Thereby, a coating 62 is applied on the light-receiving surface 70a via the printing plate 80. After finger electrodes and bus bar electrodes 22 are formed on the light-receiving surface 70a of the solar cell element 70, the coating 62 is applied by moving the squeegee 84 in the y direction in which the finger electrodes extend.

The printing plate 80 has a mesh 80a made of metal and an emulsion 80b placed in accordance with the pattern of the printing plate 80. An area in which the emulsion 80b is provided is an area in which the coating 62 is not applied, and areas W in which the emulsion 80b is not provided correspond to the openings 82c and 82d of the printing plate 80. The open areas W are provided such that the respective outer peripheries of the open areas W are larger than those of respective first areas E1, which correspond to application areas on the light-receiving surface 70a, and the open areas W lie across both the respective first areas E1 and respective second areas E2, which are provided to surround the respective outer peripheries of the first areas E1. By providing an opening in areas corresponding to the second areas E2, the coating 62 can be also applied to the respective side surfaces 70c.

Also, by applying the coating 62 after the bus bar electrodes 22 are provided, a distance d can be kept between the light-receiving surface 70a and the mesh 80a in comparison with a case where there is no bus bar electrode 22, and the thickness of the coating 62 can be increased. The thickness of the coating 62 that is applied can be increased by increasing the thickness of the emulsion 80b of the printing plate 80. However, defective application such as inability to apply the coating 62 evenly may be caused when the thickness of the emulsion 80b is increased. Therefore, by applying the coating 62 after the bus bar electrodes 22 are provided, the thickness of the coating 62 that is applied can be increased while keeping the thickness of the emulsion 80b to be thin in order to prevent defective application.

Since the solar cell element 70 is not provided under the second areas E2, coatings 62f that are pushed out by the squeegee 84 are easily accumulated at respective positions corresponding to the second areas E2. Using these coatings 62f that have been accumulated, the coatings 62f can be thickly applied to the respective side surfaces 70c. However, if the solar cell element 70 is placed on a flat stage, the coatings 62f may become attached to the stage. In that case, the stage and the solar cell element 70 are bonded to each other by the coatings, and there is a possibility of breakage due to application of stress to the solar cell element 70 when picking up the solar cell element 70 from the stage.

Thus, in the present embodiment, in order to prevent the coatings 62f accumulated in the second areas E2 from attaching to the stage, a stage 90 is used on which a groove 94 is provided at a position corresponding to the outer periphery of the solar cell element 70.

Figure 18:
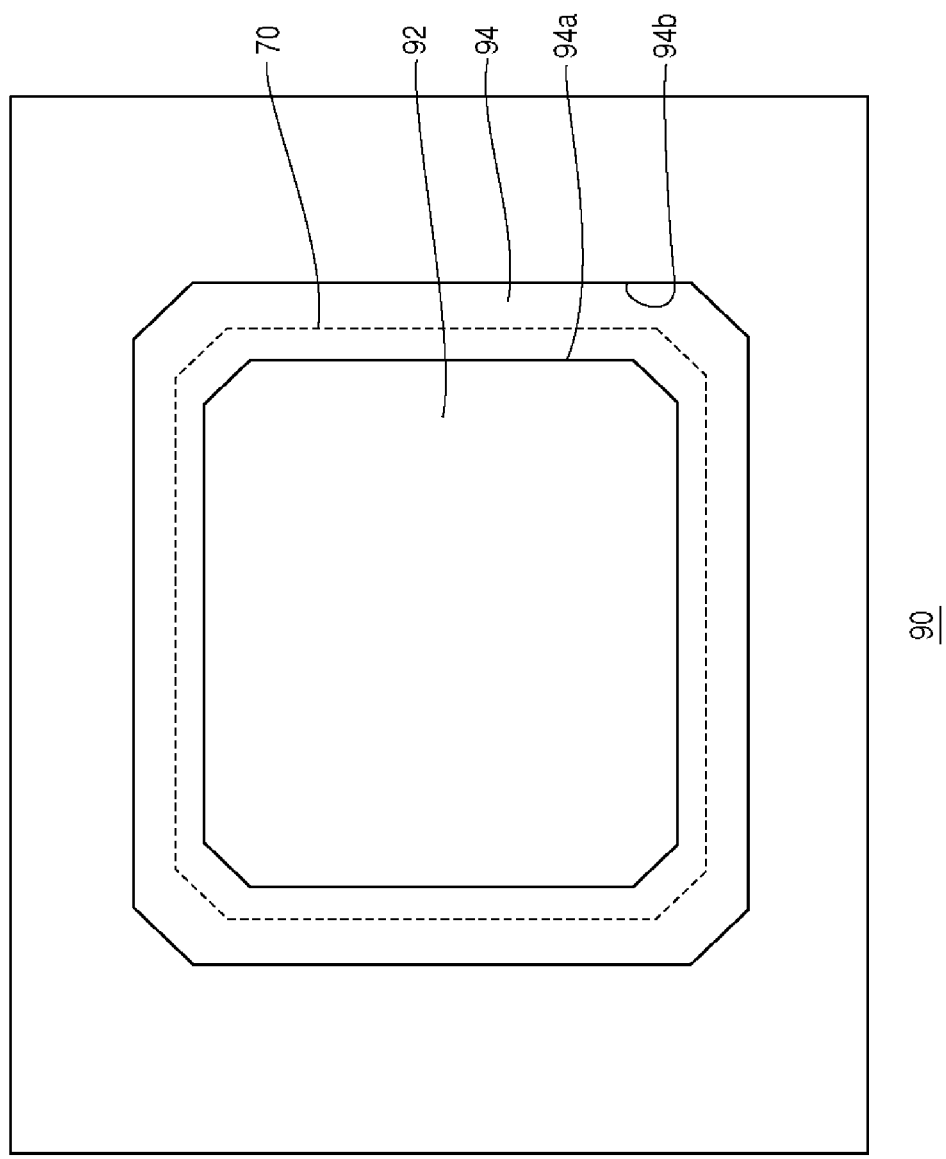
FIG. 18 is a top view illustrating a stage on which the solar cell element according to the embodiment of the present invention is placed.

FIG. 18 is a top view illustrating the stage 90 on which the solar cell element 70 is placed. In the figure, a position where the solar cell element 70 is placed is indicated by a dashed line. The stage 90 has the groove 94 provided at a position corresponding to the outer periphery of the solar cell element 70. The groove 94 has a first side wall 94a and a second side wall 94b. The first side wall 94a is a side wall inside the groove 94 and is provided to be smaller than the outer periphery of the solar cell element 70. The second side wall 94b is a side wall outside the groove 94 and is provided to be larger than the outer periphery of the solar cell element 70. A flat mounting surface 92 on which the solar cell element 70 is to be placed is provided inside the groove 94. Shown in the figure is the groove 94 corresponding to an octagon shape, which is the external shape of the solar cell element 70. However, the groove 94 may have a rectangle shape or a circular shape as well as an octagon shape.

Figure 19:
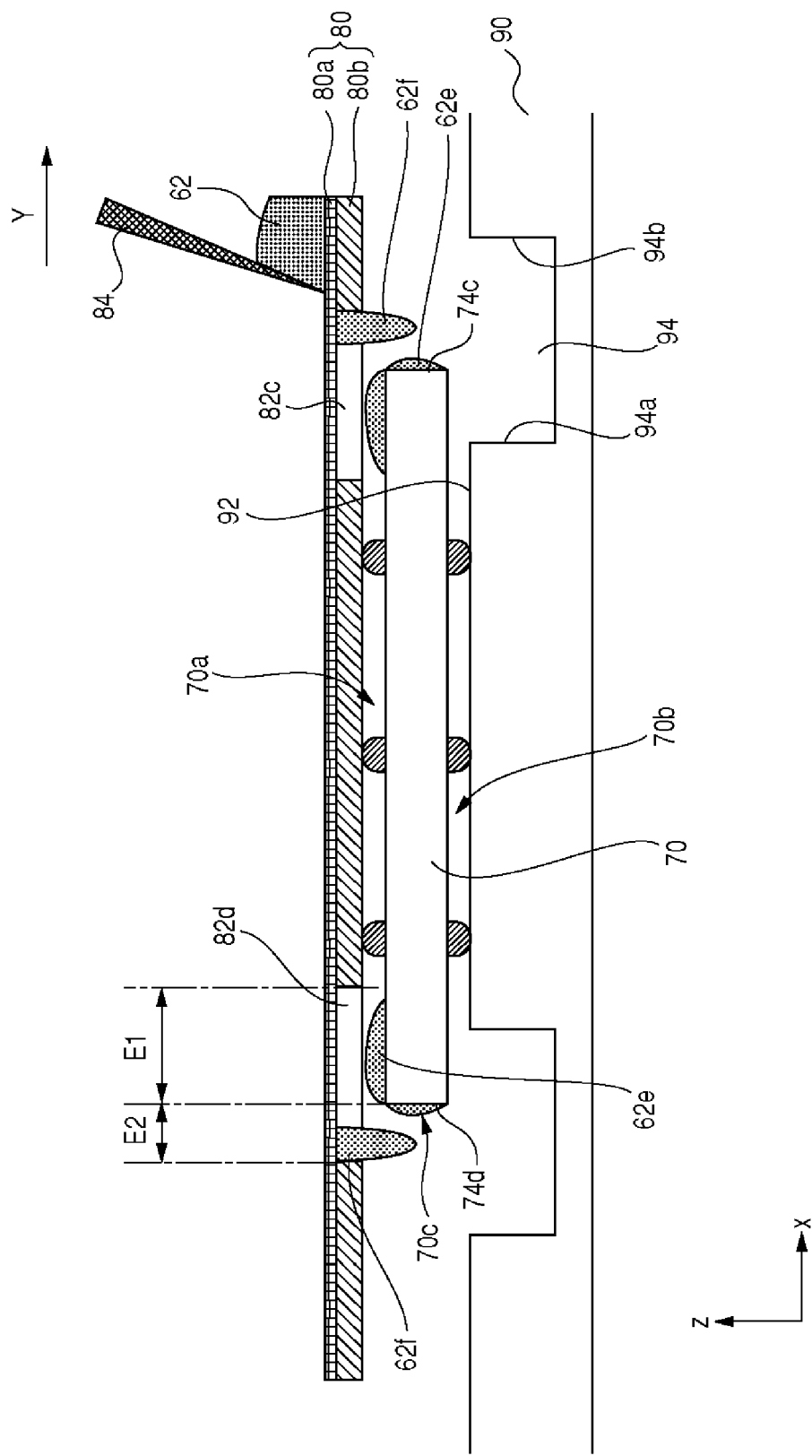
FIG. 19 is a diagram illustrating a process of applying a light diffusion portion by screen printing according to the embodiment of the present invention.
Figure 20:
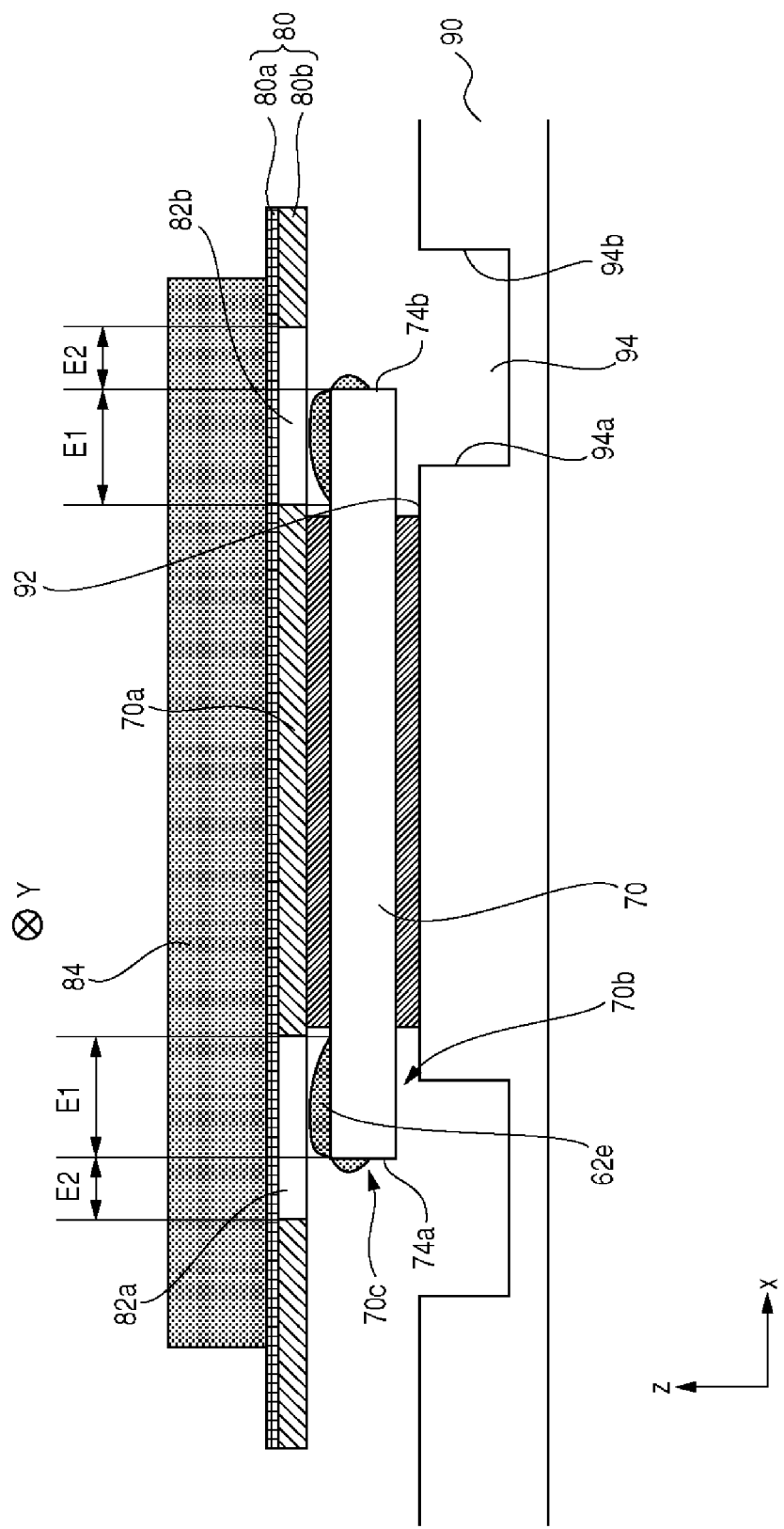
FIG. 20 is a diagram illustrating a process of applying a light diffusion portion by screen printing according to the embodiment of the present invention.

FIGS. 19 and 20 are diagrams illustrating a process of applying the light diffusion portion 60 by screen printing. FIG. 19 is a diagram illustrating a process of applying a coating 62e that is provided along the upper side 74c and the lower side 74d and illustrates a cross section in a direction perpendicular to the bus bar electrodes 22. By moving the squeegee 84 in a Y direction, the coating 62e can be applied to substantially the respective entire surfaces of the side surfaces 70c corresponding to the upper side 74c and the lower side 74d, respectively, using a coating 62f that is accumulated in a second area E2.

FIG. 20 is a diagram illustrating a process of applying the coating 62e that is provided along the left side 74a and the right side 74b and illustrates a cross section in a direction along the bus bar electrodes 22. By moving the squeegee 84 in a Y direction, the coating 62e can be applied along the left side 74a and the right side 74b.

After that, a light diffusion portion 60 is formed by hardening the coating 62e applied by screen printing.

An explanation will be given next regarding a process of forming a solar cell module 200 by connecting a plurality of solar cell elements 70 by tab wiring 72.

A solar cell element 70 on which a light diffusion portion 60 is formed is connected to another solar cell element 70 by the tab wiring 72. The tab wiring 72 is connected to bus bar electrodes 22 provided on a light-receiving surface 70a of one solar cell element 70 and to bus bar electrodes provided on a back surface of the other solar cell element. After the solar cell element 70 on which the light diffusion portion 60 is formed is connected by the tab wiring 72, a first sealing layer 42 and a protection substrate 40 are placed on the side of the light-receiving surface 70a, and a second sealing layer 44 and a back sheet 50 are placed on a back surface 70b. A solar cell module 200 is formed by thermocompression-bonding the solar cell element 70 while the solar cell element 70 is sandwiched between the protection substrate 40 and the back sheet 50.

While the invention has been described by referring to the above-described embodiments, the invention is not limited to the above-described embodiments, and the appropriate combination of the configurations of the embodiments or the substitution thereof is also included in the invention. Further, the combination of the embodiments or the process sequence thereof may be appropriately set or various modifications in design may be added to the embodiments based on the knowledge of the person skilled in the art. An embodiment having such modifications may be also included in the scope of the invention.

In the above-stated embodiments, a case where a convex surface formed by a light diffusion portion 60 has a smooth shape is shown as shown in FIG. 3. However, a fine concavo-convex structure may be provided on the convex surface in order to further improve the scattering efficiency.

Figure 21:
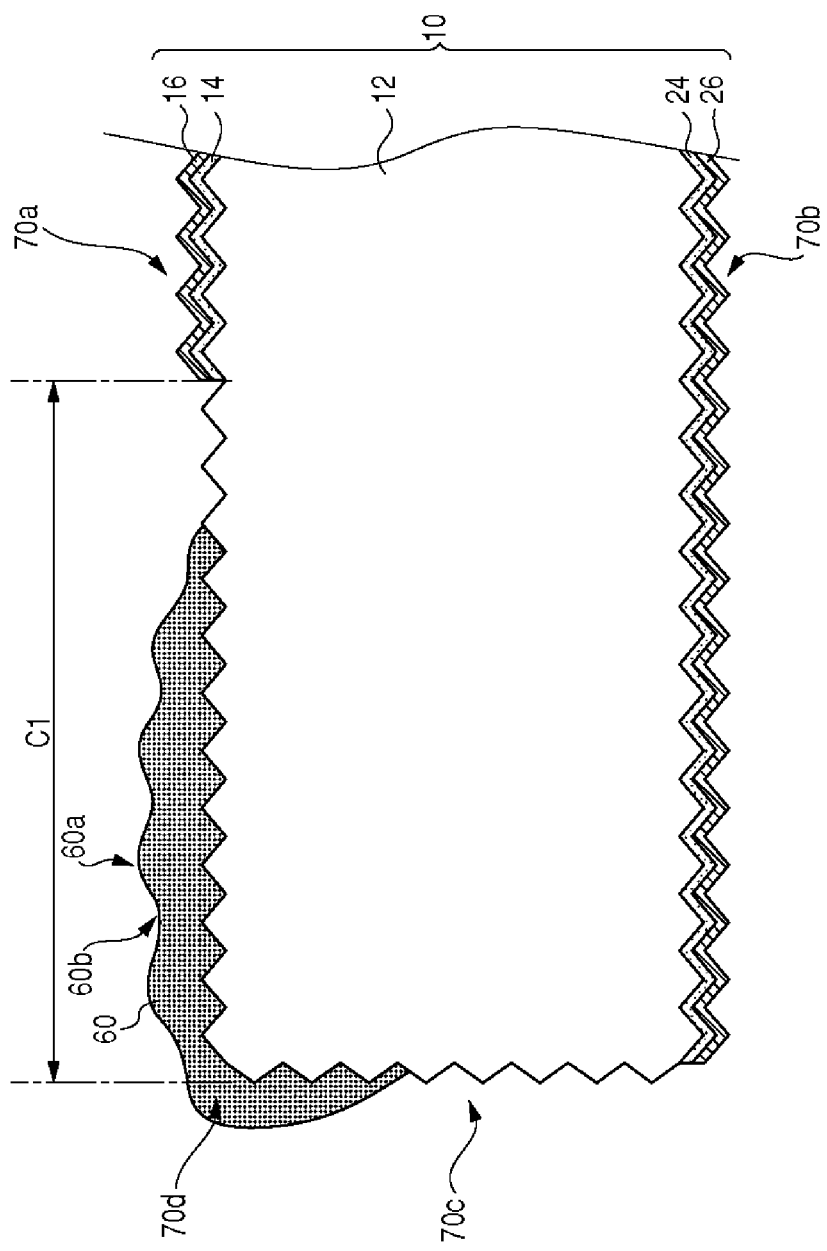
FIG. 21 is a cross-sectional view illustrating a light diffusion portion according to a first exemplary variation.
Figure 22:
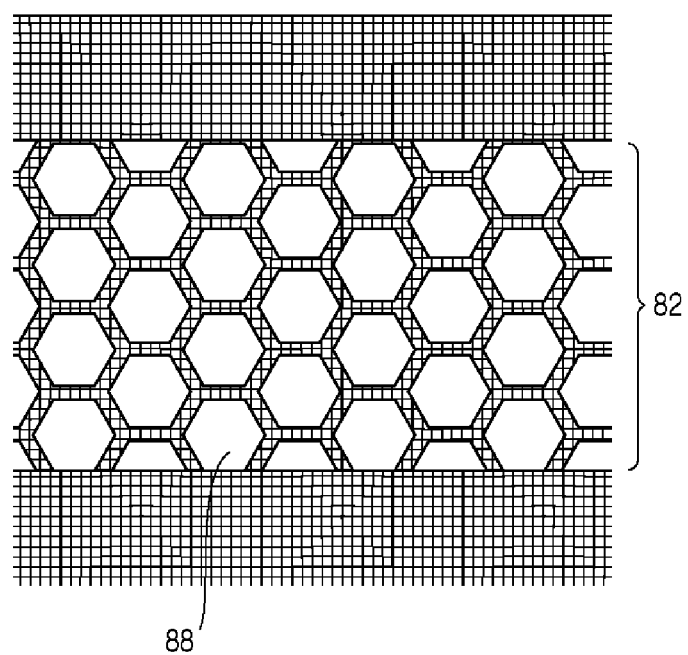
FIG. 22 is a diagram schematically illustrating a pattern of a printing plate according to the first exemplary variation.

FIG. 21 is a cross-sectional view illustrating a light diffusion portion 60 according to a first exemplary variation, and a plurality of convex portions 60a and concave portions 60b are formed as a fine concavo-convex structure provided on a convex surface. In order to form such a light diffusion portion 60, a pattern on which minute concave portions or openings are arranged may be used as a printing plate used for the application of a coating 62. FIG. 22 is a diagram schematically illustrating a minute pattern 88 of a printing plate according to the first exemplary variation, and minute patterns 88 arranged in a hexagonal lattice shape, as shown in FIG. 22, are formed in the area of the pattern 82 shown in FIG. 5. Application of a coating using a printing plate on which such minute patterns 88 are formed creates unevenness, in accordance with the minute patterns 88, in the amount of the coating that is applied, and a light diffusion portion 60 with a gentle convex surface on which fine concavities and convexities are arranged in a hexagonal lattice shape is formed. The shape of the minute patterns 88 is not limited to a hexagonal lattice shape. Alternatively, patterns arranged in a tetragonal lattice shape, patterns arranged randomly, or the like may be used.

Figure 23:
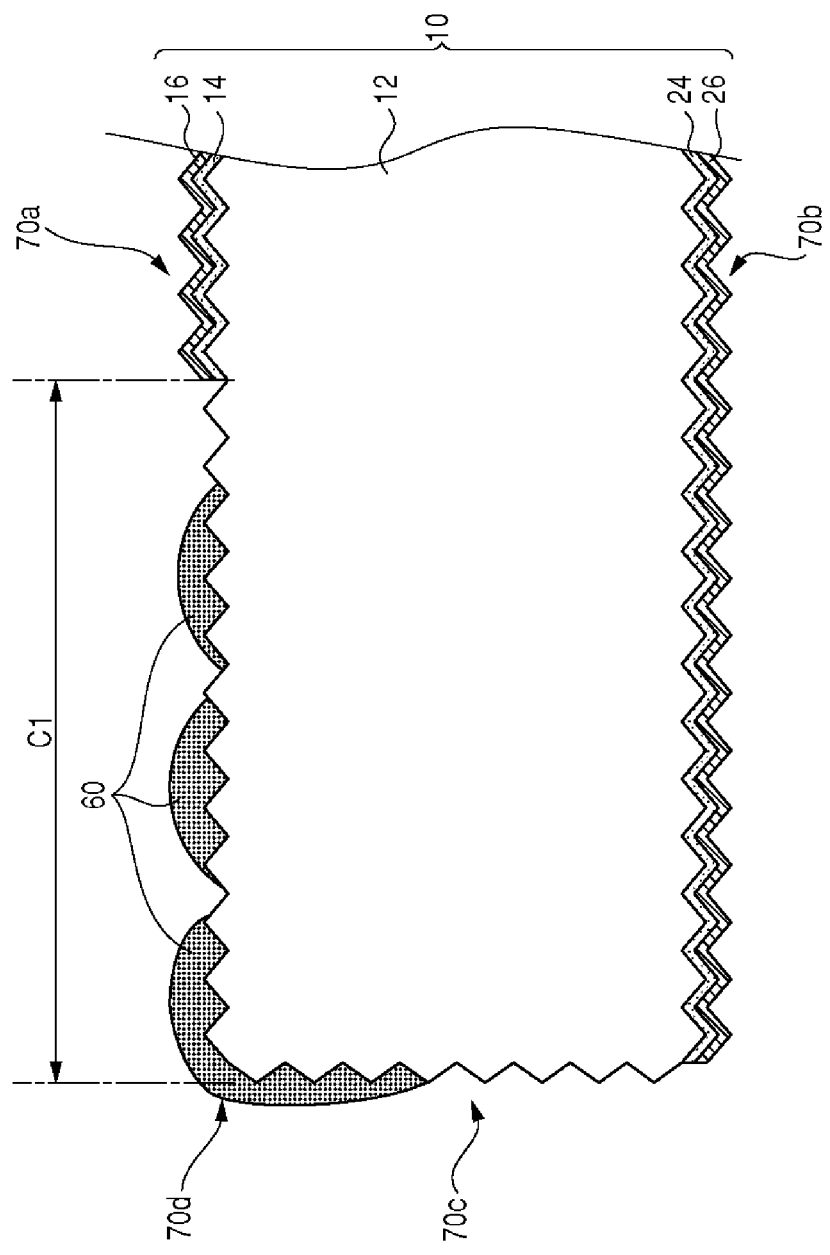
FIG. 23 is a cross-sectional view illustrating a light diffusion portion according to a second exemplary variation.

FIG. 23 is a cross-sectional view illustrating a light diffusion portion 60 according to a second exemplary variation, and a plurality of light diffusion portions 60 are provided for an outer peripheral area C1. By providing a plurality of light diffusion portions 60 having a convex surface in this manner, convex portions where the light diffusion portions 60 are provided and concave portions where the light diffusion portions 60 are not provided are formed, and the light diffusivity can be increased. In order to form such light diffusion portions 60, a printing plate may be used in which a pattern area where a coating is applied is reduced in size, compared to a case according to the second exemplary variation, in the minute patterns 88 shown in FIG. 22, or a coating with increased viscosity may be used.

Figure 24:
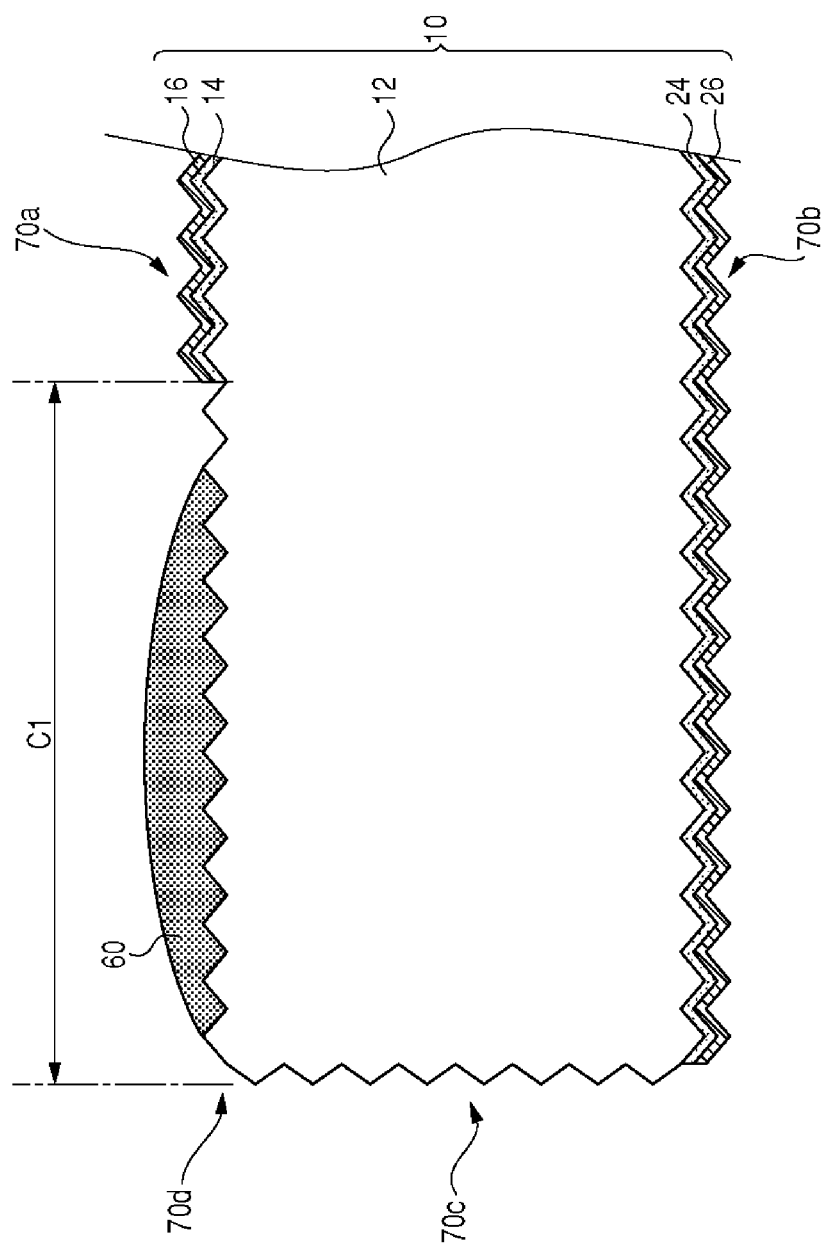
FIG. 24 is a cross-sectional view illustrating a light diffusion portion according to a third exemplary variation.

FIG. 24 is a cross-sectional view illustrating a light diffusion portion 60 according to a third exemplary variation. The light diffusion portion 60 is not provided on a side surface 70c and is provided only on a light-receiving surface 70a. Even in a case of such a structure, the light diffusion portion 60 forms a convex surface with a gentle arc, and the light diffusivity can thus be increased by the light diffusion portion 60. In comparison to a case where a light diffusion portion 60 is formed also on a side surface 70c, the amount of a coating that is used can be reduced. A light diffusion portion 60 may be provided on a back surface 70b of a solar cell element 70.

Figure 25:
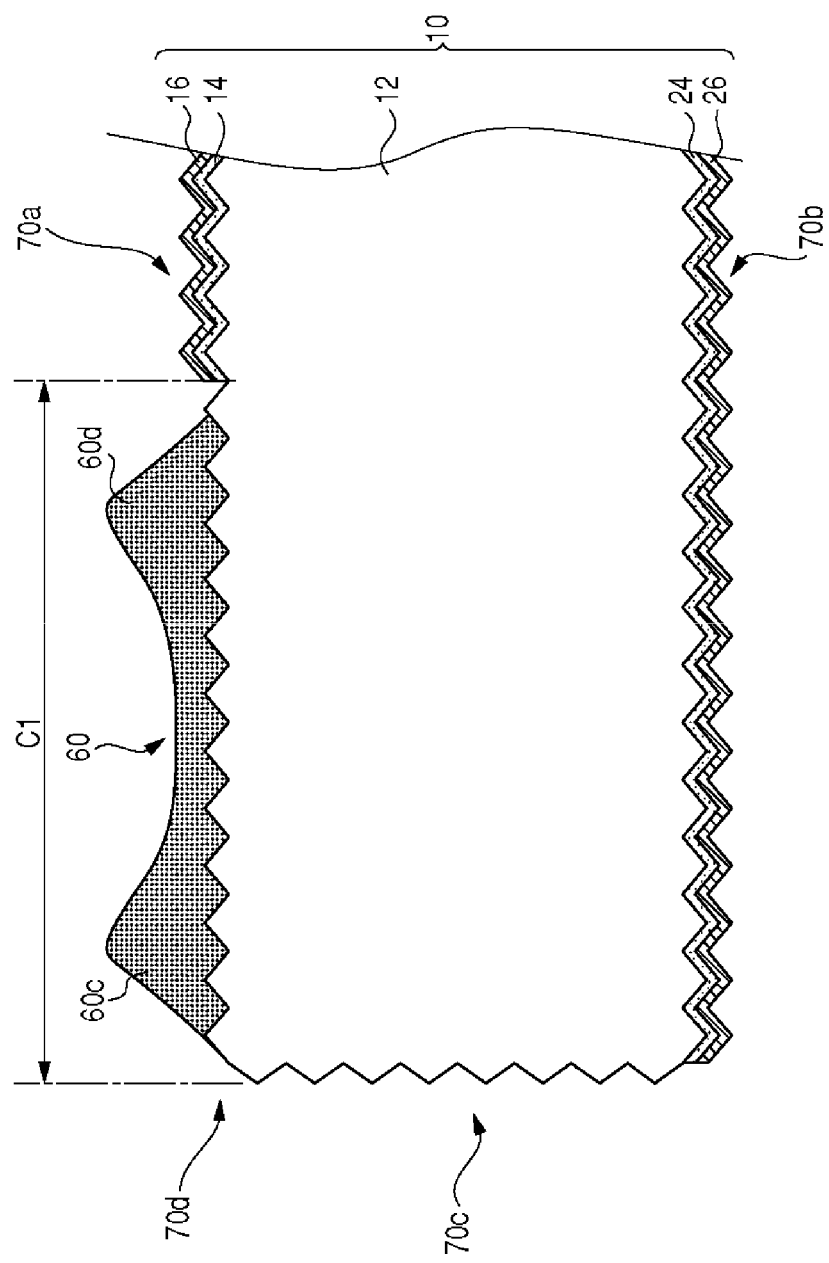
FIG. 25 is a cross-sectional view illustrating a light diffusion portion according to a fourth exemplary variation.

FIG. 25 is a cross-sectional view illustrating a light diffusion portion 60 according to a fourth exemplary variation. The light diffusion portion 60 is provided on a light-receiving surface 70a, and a first convex portion 60c and a second convex portion 60d are provided respectively on the opposite ends thereof in a short-side direction (in a horizontal direction on the paper). A light diffusion portion 60 having such a shape can be formed, for example, by using a coating with high viscosity in screen printing. This is because, when a printing plate that is in close contact with the light-receiving surface 70a of the solar cell element 70 is moved away from the light-receiving surface 70a, the coating that has been applied is pulled up by the edge of the printing plate, allowing both edges of the light diffusion portion 60 to stick out. By allowing the both edges of the light diffusion portion 60 to stick out in this manner, a curved surface with a large curvature can be formed. Thus, light that becomes incident on the light diffusion portion 60 can be efficiently diffused.

Figure 26:
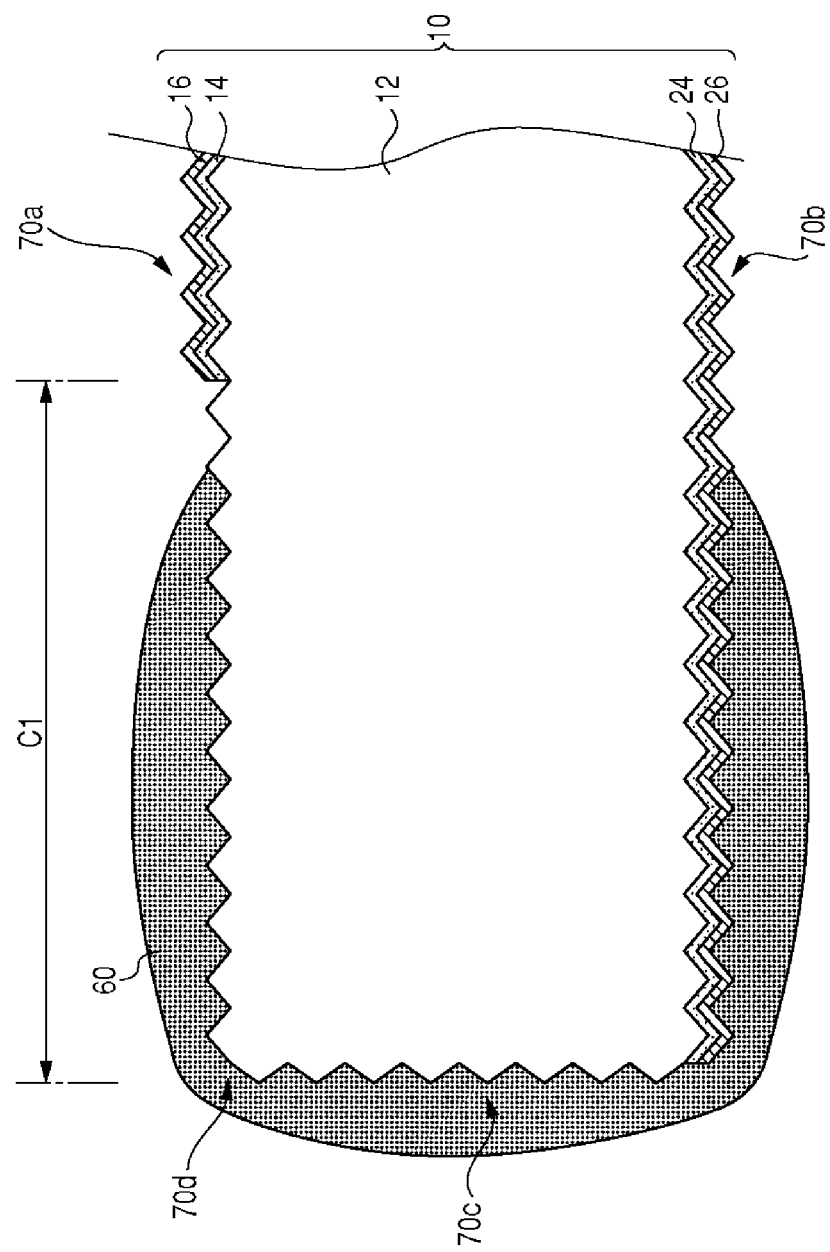
FIG. 26 is a cross-sectional view illustrating a light diffusion portion according to a fifth exemplary variation.

FIG. 26 is a cross-sectional view illustrating a light diffusion portion according to a fourth exemplary variation. A light diffusion portion 60 covers a corner 70d and a side surface 70c and is provided on a back surface 70b. The light diffusion portion 60 forms a convex surface with a gentle arc even on the side surface 70c and on the back surface 70b. By employing such a structure, light that becomes incident on an invalid area on the side surface 70c or the back surface 70b, as well as light that becomes incident on an invalid area of a light-receiving surface 70a, can be directed to a valid area of the solar cell element 70, and the utilization efficiency of the incident light can be increased. In order to form such a light diffusion portion 60, a coating needs to be applied on the side surface 70c so that the respective outer peripheral areas of the light-receiving surface 70a and the back surface 70b are covered by the coating that is applied. A light diffusion portion 60 may be formed by applying a coating on the back surface 70b after a coating is applied on the light-receiving surface 70a such that the coatings on the respective surfaces overlap with each other on the side surface 70c. A light diffusion portion 60 may be provided only on the light-receiving surface 70a and the back surface 70b of the solar cell element 70 without providing a light diffusion portion 60 on the side surface 70c.

Figure 27:
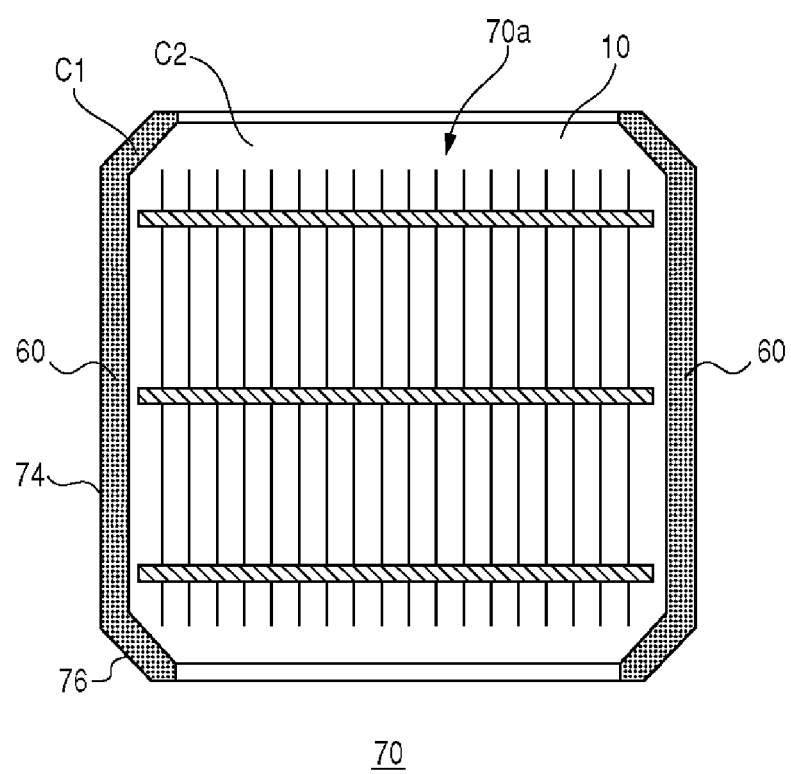
FIG. 27 is a diagram illustrating an area in which a light diffusion portion according to a sixth exemplary variation is provided.

FIG. 27 is a diagram illustrating an area in which a light diffusion portion 60 according to a fifth exemplary variation is provided. A light diffusion portion 60 is not provided to cover the entire surface of the outer peripheral area C1. A light diffusion portion 60 is provided in areas that correspond to two sides out of four long sides 74 that form the outer peripheral area C1. As described, even when a light diffusion portion 60 is provided on a part of the outer peripheral area C1, light that is incident on the outer peripheral area C1 can be more effectively used compared to a case where a light diffusion portion 60 is not provided, and the efficiency of the generation of electricity can be increased. A light diffusion portion 60 may be provided only in an area that corresponds to one side out of the four long sides 74 that form the outer peripheral area C1. Alternatively, a light diffusion portion 60 may be provided in areas that correspond to three sides thereof. A light diffusion portion 60 may be provided only in areas that correspond to any one of one side, two sides, three sides, and four sides out of four short sides 76 that form the outer peripheral area C1. In short, a light diffusion portion 60 needs to be provided in the entire or a part of the outer peripheral area C1, which is an invalid area.

Figure 28:
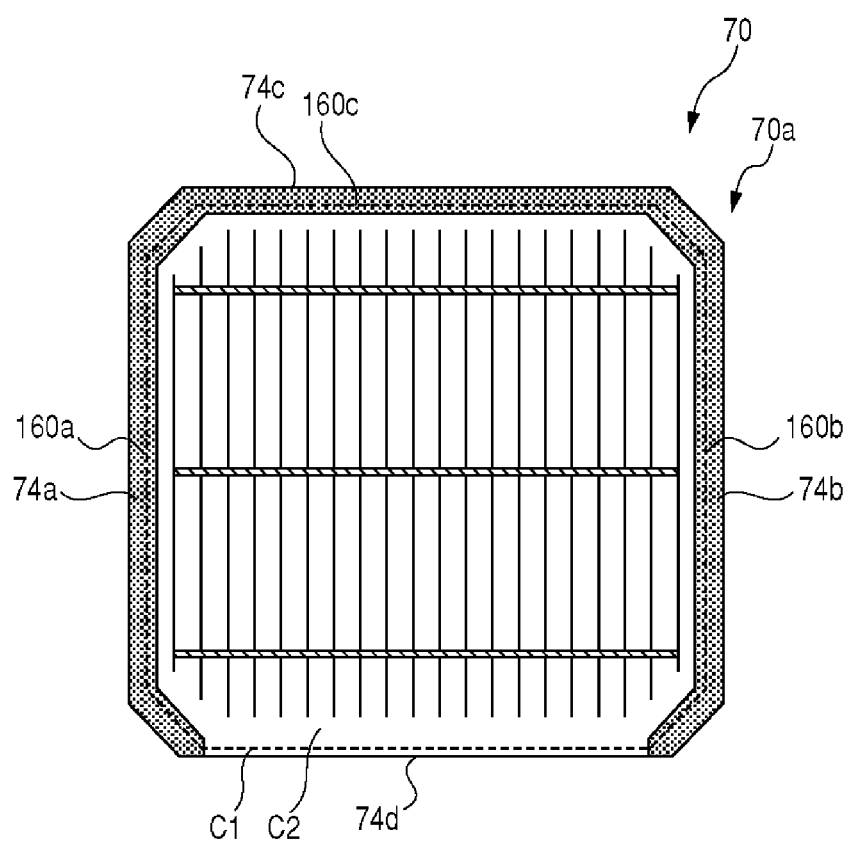
FIG. 28 is a diagram illustrating an area in which a light diffusion portion according to a seventh exemplary variation is provided.

FIG. 28 is a diagram illustrating an area in which a light diffusion portion 160 according to a sixth exemplary variation is provided. In the present exemplary variation, a light diffusion portion 160 is provided along three long sides 74a through 74c in the solar cell element 70 according to the third embodiment. Therefore, the difference from the solar cell element 70 according to the third embodiment shown in FIG. 14 lies in that the light diffusion portion 160 is not provided along a lower side 74d. A range of the outer peripheral area C1 that corresponds to the lower side 74d is smaller than a range of the outer peripheral area C1 that corresponds to the other long sides 74a through 74c. Thus, the contribution to the improvement in the efficiency of the generation of electricity achieved by providing the light diffusion portion 160 is small. Thus, the light diffusion portion 160 may be designed not to be provided in the range of the outer peripheral area C1 that corresponds to the lower side 74d. This allows the amount of a coating 62 that is used to be reduced, thereby allowing the manufacturing cost to be lowered.

Figure 29:
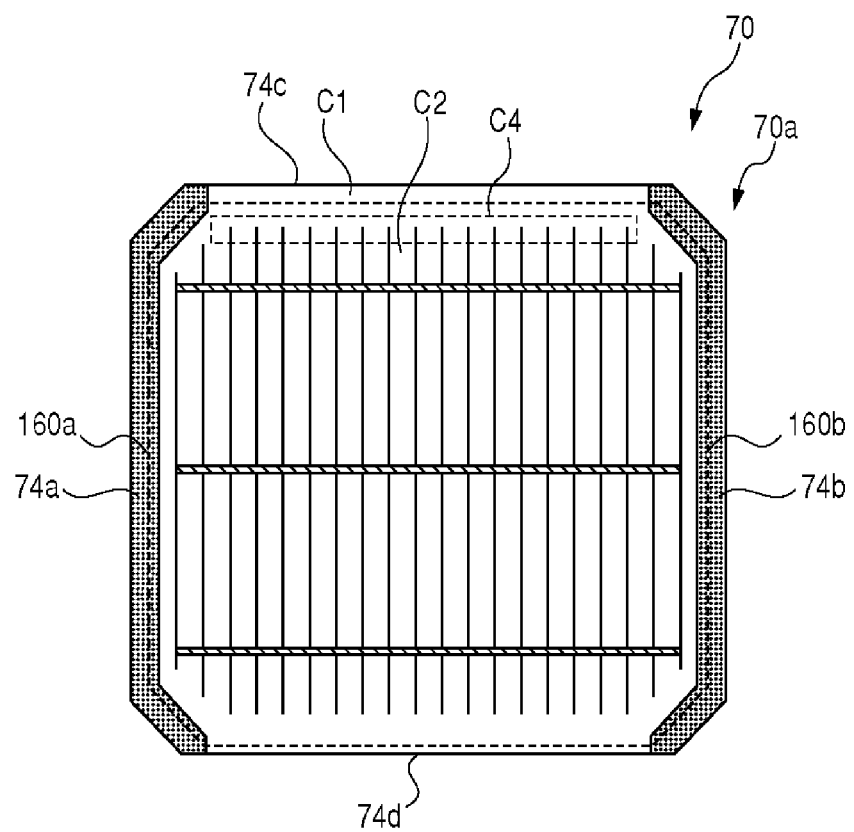
FIG. 29 is a diagram illustrating an area in which a light diffusion portion according to an eighth exemplary variation is provided.

FIG. 29 is a diagram illustrating an area in which a light diffusion portion 160 according to a seventh exemplary variation is provided. In the present exemplary variation, a light diffusion portion 160 is provided along two long sides 74a and 74b in the solar cell element 70 according to the third embodiment. Therefore, the difference from the solar cell element 70 shown in FIG. 28 lies in that the light diffusion portion 160 is not provided along an upper side 74c. A range of the outer peripheral area C1 that corresponds to the upper side 74c is smaller than respective ranges of the outer peripheral area C1 that correspond to the left side 74a and the right side 74b. Thus, the contribution to the improvement in the efficiency of the generation of electricity achieved by providing the light diffusion portion 160 is small. Even if a light diffusion portion 160 is provided in a range of the outer peripheral area C1 that corresponds to the upper side 74c, the contribution to the improvement in the efficiency of the generation of electricity by light that becomes incident again is small since, even when a light diffusion portion 160 is provided, the efficiency of the generation of electricity of an adjacent area C4 on which light diffused by the light diffusion portion 160 becomes incident again is low. Thus, the light diffusion portion 160 may be designed not to be provided in the range of the outer peripheral area C1 that corresponds to the upper side 74c. This allows the amount of a coating 62 that is used to be further reduced, thereby allowing the manufacturing cost to be lowered.

In the above-described embodiments, a case is shown where a solar cell element 70 with a light-receiving surface 70a having an octagon shape is used. However, a light diffusion portion 160 may be formed on a rectangular solar cell element whose light-receiving surface is formed with four sides. In this case, a light diffusion portion 160 needs to be provided in at least an area that corresponds to one side out of the four sides that form the light-receiving surface, and a light diffusion portion 60 may be formed in the entire surface of the outer peripheral area corresponding to the four sides.

In the above-described embodiments, a case is shown where offset printing and screen printing are used as methods for printing a coating. However, other printing methods may be used. For example, a pyramid-shaped pad having a bottom area that corresponds to the shape of a solar cell element 70 may be prepared, and a pad printing method may be used where a coating transferred to the pad from a printing plate 80 is applied to an outer peripheral area C1 of a light-receiving surface 70a. In addition, a coating may be applied by a well-known technique such as letterpress printing, intaglio printing, or the like.

In the above-described embodiments, a solar cell element 70 and a light diffusion portion 60 are shown as different members. However, a solar cell element itself may be provided with a light diffusion portion 60 provided on a surface thereof. A solar cell element provided with a light diffusion portion 60 may be sealed by a protection substrate, a back sheet, and a sealing layer so as to serve as a solar cell module.

In the above-described embodiments, a first transparent electrode layer 18 is formed such that the area of the first transparent electrode layer 18 provided on a light-receiving surface 70a of a solar cell element 70 falls inside an area in which a second transparent electrode layer 28 on a back surface 70b is provided. In additional exemplary variations, the second transparent electrode layer 28 may be formed such that the area of the second transparent electrode layer 28 provided on the back surface 70b falls inside the area of the first transparent electrode layer 18 provided on the light-receiving surface 70a. In other words, the relationship of the size of an area in which a transparent electrode layer is provided may be reversed between the light-receiving surface 70a and the back surface 70b so that the formation area of the second transparent electrode layer 28 is smaller than that of the first transparent electrode layer 18. In this case, an area on the light-receiving surface 70a where the first transparent electrode layer 18 is provided but the second transparent electrode layer 28 is not provided on the back surface 70b serves as a boundary area even though incident light is unlikely to contribute to the generation of electricity in the area. At this time, the efficiency of the generation of electricity can be increased by providing a light diffusion portion 60 in this boundary area as well as an invalid area.

In a solar cell element 70 shown in the above-described embodiments, a first conductivity type layer 16 provided on the side of a light-receiving surface 70a is p-type amorphous silicon, and a second conductivity type layer 26 provided on the side of a back surface 70b is n-type amorphous silicon. Alternatively, a solar cell element may be used where the conductivity types are switched. A base substrate 12 may be a p-type crystalline silicon substrate.

Further, a light diffusion portion 60 may be formed in an outer peripheral area or invalid area of a solar cell element achieved by a structure or manufacturing method that is different from that of a solar cell element 70 shown in the above-described embodiments. An explanation will be given in the following regarding a solar cell element 170 according to a fourth embodiment and a solar cell element 270 according to a fifth embodiment each as a solar cell element that is different from those according to the above-described embodiments.

Fourth Embodiment

Figure 30:
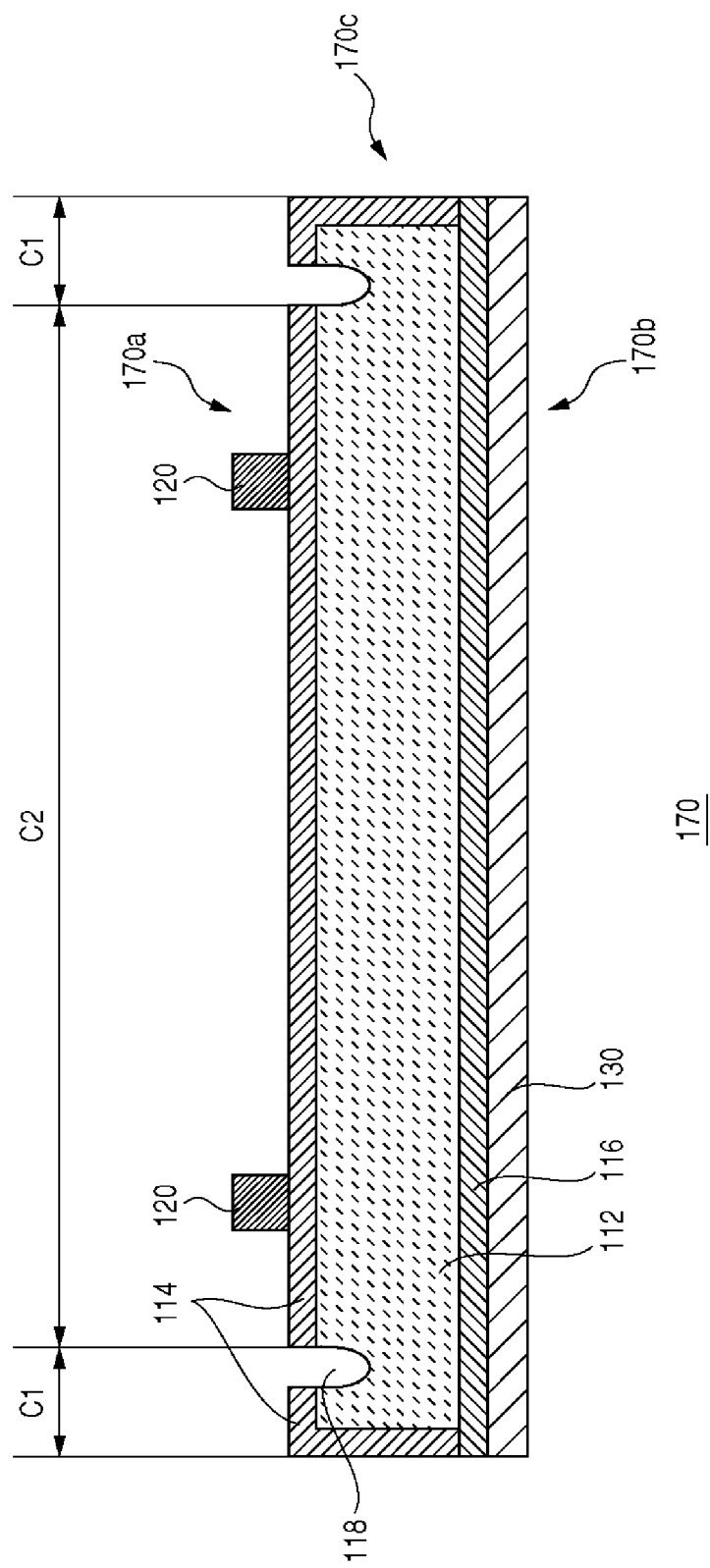
FIG. 30 is a cross-sectional view illustrating the solar cell element according to the embodiment of the present invention.

FIG. 30 is a cross-sectional view illustrating a solar cell element 170 according to the fourth embodiment. The solar cell element 170 is a laser isolation type solar cell element where an invalid area C1 and a valid area C2 are separated by a groove 118 formed by laser irradiation on a light-receiving surface 170a. The solar cell element 170 is provided with a base substrate 112, a first conductivity type area 114, a second conductivity type area 116, a first electrode 120, and a second electrode 130.

The base substrate 112 is a crystalline semiconductor layer and is, for example, a p-type crystalline silicon substrate. The first conductivity type area 114 is an area made of n-type crystalline silicon and is, for example, an n-type diffused area in which n-type impurities are diffused. The first conductivity type area 114 is provided such that the first conductivity type area 114 covers one of the main surfaces and the side surfaces of the base substrate 112. The second conductivity type area 116 is an area made of p-type crystalline silicon and is, for example, a p-type diffused area in which p-type impurities are diffused. The second conductivity type area 116 is provided such that the second conductivity type area 116 covers the other main surface of the base substrate 112.

The first electrode 120 is an electrode provided on a light-receiving surface 170a of a solar cell element 170 and is provided on the first conductivity type area 114. A transparent electrode layer may be provided between the first electrode 120 and the first conductivity type area 114. The second electrode 130 is an electrode provided on a back surface 170b of the solar cell element 170 and is provided below the second conductivity type area 116.

The groove 118 formed by removal of a portion of the first conductivity type area 114 is provided on the light-receiving surface 170a. The groove 118 is provided along the periphery of the light-receiving surface 170a and separates the first conductivity type area 114 into two areas: an outer peripheral area C1; and an inner area C2. The formation of the groove 118 prevents a short circuit, via a first conductivity type area 114 on the side surfaces, between a first conductivity type area 114 to which the first electrode 120 is connected and the second conductivity type area 116 to which the second electrode 130 is connected. This allows for recombination of electrons and holes that are created by light incident on the light-receiving surface 170a, preventing a decrease in the efficiency of the generation of electricity. By the separation of the first conductivity type area 114 by the groove 118, the inner area C2 becomes a valid area where incident light contributes to the generation of electricity, and the outer peripheral area C1 becomes an invalid area where incident light is unlikely to contribute to the generation of electricity.

A manufacturing method of the solar cell element 170 will be shown next. After forming an n-type silicon layer by diffusing phosphorus (P) atoms as dopants on each of the surfaces of a p-type crystalline silicon substrate, an aluminum electrode is connected to one of the surfaces, and aluminum (Al) atoms are then diffused so that the corresponding layer becomes a p-type crystalline silicon layer again. After that, a groove is formed by removing a part of the n-type layer by laser irradiation or the like so that no short circuit is caused between the p-type layer on the side of the aluminum electrode and the n-type layer on the back side thereof through the side surfaces.

An invalid area is formed even in such a laser isolation type solar cell element 170. Thus, by covering an outer peripheral area C1, which serves as an invalid area, with a light diffusion portion, light that is heading to the invalid area can be scattered, and the light can be effectively used.

Fifth Embodiment

Figure 31:
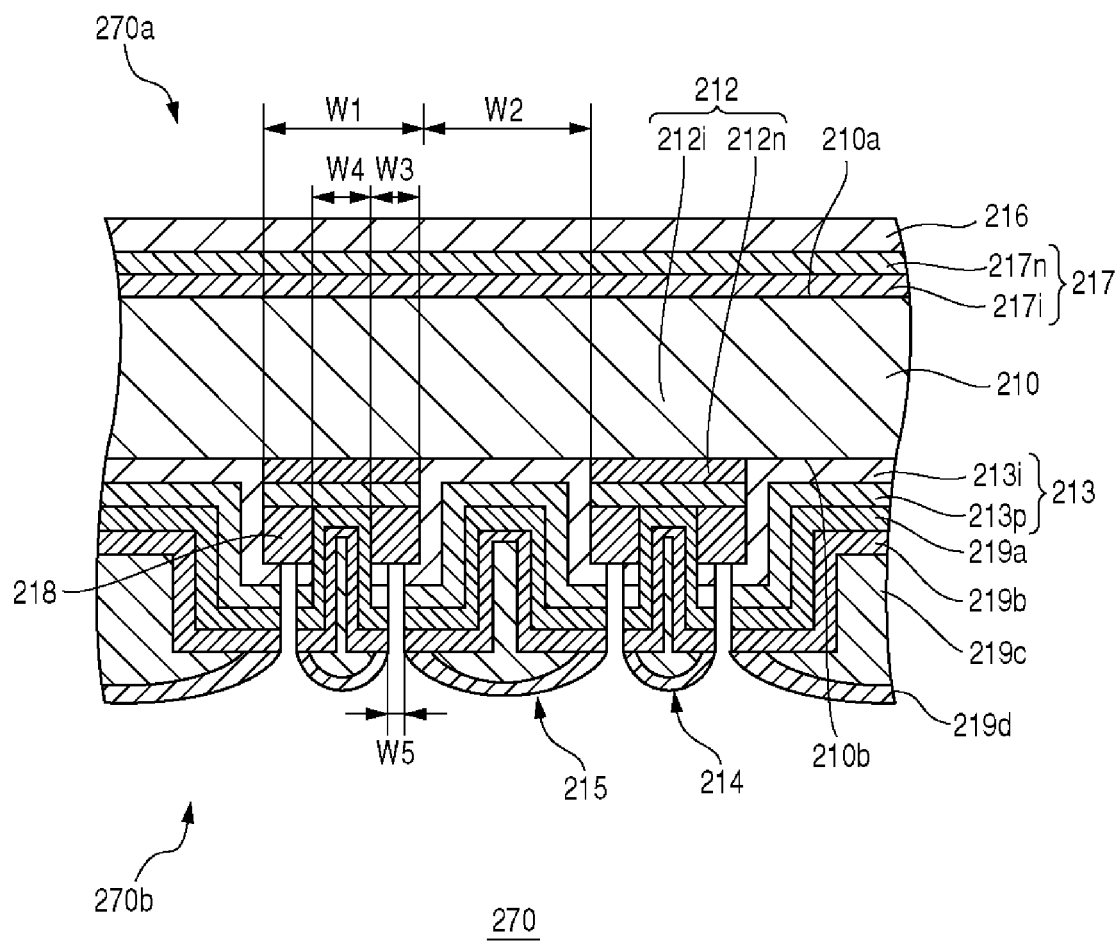
FIG. 31 is a cross-sectional view illustrating a structure according to the embodiment of the present invention.

FIG. 31 is a cross-sectional view illustrating the structure of a solar cell element 270 according to the fifth embodiment. The solar cell element 270 is a back surface junction type solar cell element where no electrode is provided on a light-receiving surface 270a and where a first electrode 214 and a second electrode 215 are provided on a back surface 270b. Regarding the solar cell element 270, differences from the above-described embodiments will be mainly shown in the following.

The solar cell element 270 is provided with a base substrate 210, a first stacked body 212, a second stacked body 213, a first electrode 214, a second electrode 215, a first insulating layer 216, and a third stacked body 217.

The base substrate 210 has a first principle surface 210a on the side of the light-receiving surface 270a and a second principle surface 210b on the side of the back surface 270b. The base substrate 210 creates electrons and holes that serve as carriers mainly by light incident on the first principle surface 210a. The base substrate 210 is a crystalline semiconductor substrate and is, for example, a crystalline silicon substrate such as a monocrystalline silicon substrate, a polycrystalline silicon substrate, or the like. An n-type monocrystalline silicon substrate is used as the base substrate 210 in this embodiment.

The third stacked body 217 and the first insulating layer 216 are stacked in order on the first principle surface 210a of the base substrate 210. The third stacked body 217 has a third i-type layer 217i, which is a genuine non-crystalline semiconductor, and a third conductivity type layer 217n having the same conductivity type as that of the base substrate 210. In the present embodiment, the third i-type layer 217*i* is i-type amorphous silicon containing hydrogen, and the third conductivity type layer 217*n* is n-type amorphous silicon containing hydrogen. The first insulating layer 216 is a layer that has both a function as an antireflection film and a function as a protection film and is, for example, a layer formed of silicon oxide ($SiO_2$), silicon nitride (SiN), silicon oxynitride (SiON), or the like. The first insulating layer 216 and the third stacked body 217 also have a function as a passivation layer of the base substrate 210.

A first stacked body 212 and a second stacked body 213 are formed on the second principle surface 210*b* of the base substrate 210. The first stacked body 212 and the second stacked body 213 are formed in a comb-tooth shape and formed such that the respective comb teeth are inserted into each other. Therefore, an area W1 in which the first stacked body 212 is provided and an area W2 in which the second stacked body 213 is provided are arranged alternately at intervals on the second principle surface 210*b*.

The first stacked body 212 has a first i-type layer 212*i* provided on the second principle surface 210*b* and a first conductivity type layer 212*n* provided on the first i-type layer 212*i*. The first i-type layer 212*i* is, for example, an i-type amorphous silicon layer containing hydrogen, and the first conductivity type layer 212*n* is an n-type amorphous silicon layer containing hydrogen.

A second insulating layer 218 is formed in an area W3, which corresponds to each end portion of the area W1 excluding a central portion, on the first stacked body 212. The second insulating layer 218 is provided to prevent an electrical short circuit between the first electrode 214 and the second electrode 215. The second insulating layer 218 is formed, for example, of silicon oxide, silicon nitride, silicon oxynitride, or the like. The second insulating layer 218 is desirably formed of silicon nitride containing hydrogen.

The second stacked body 213 is formed on the area W2 in which the first stacked body 212 is not formed and on the area W3 in which the second insulating layer 218 is formed. The second stacked body 213 has a second i-type layer 213*i* provided on the second principle surface 210*b* and a second conductivity type layer 213*p* provided on the second i-type layer 213*i*. The second i-type layer 213*i* is, for example, an i-type amorphous silicon layer containing hydrogen, and the second conductivity type layer 213*p* is a p-type amorphous silicon layer containing hydrogen.

The first electrode 214 is formed on the first stacked body 212, and the second electrode 215 is formed on the second stacked body 213. A groove is formed in an area W5 located between an area in which the first electrode 214 is formed and an area in which the second electrode 215 is formed, and the areas are electrically insulated. The first electrode 214 and the second electrode 215 are formed in a comb-tooth shape corresponding to the first stacked body 212 and the second stacked body 213 and formed such that the respective comb teeth engage with each other.

Each of the first electrode 214 and the second electrode 215 is formed of a stacked body of four layers: a first conductive layer 219*a* through a fourth conductive layer 219*d*. The first conductive layer 219*a* is formed of, for example, a transparent electrode layer of an indium tin oxide (ITO) or the like. The second conductive layer 219*b* and the third conductive layer 219*c* are formed of copper (Cu). The fourth conductive layer 219*d* is formed of tin (Sn). The first conductive layer 219*a* through the fourth conductive layer 219*d* are formed by a thin film formation method such as a sputtering method and a CVD method, a plating method, or the like. More specifically, the first conductive layer 219*a* and the second conductive layer 219*b* are formed by a sputtering method, and the third conductive layer 219*c* and the fourth conductive layer 219*d* are formed by a plating method.

Figure 32:
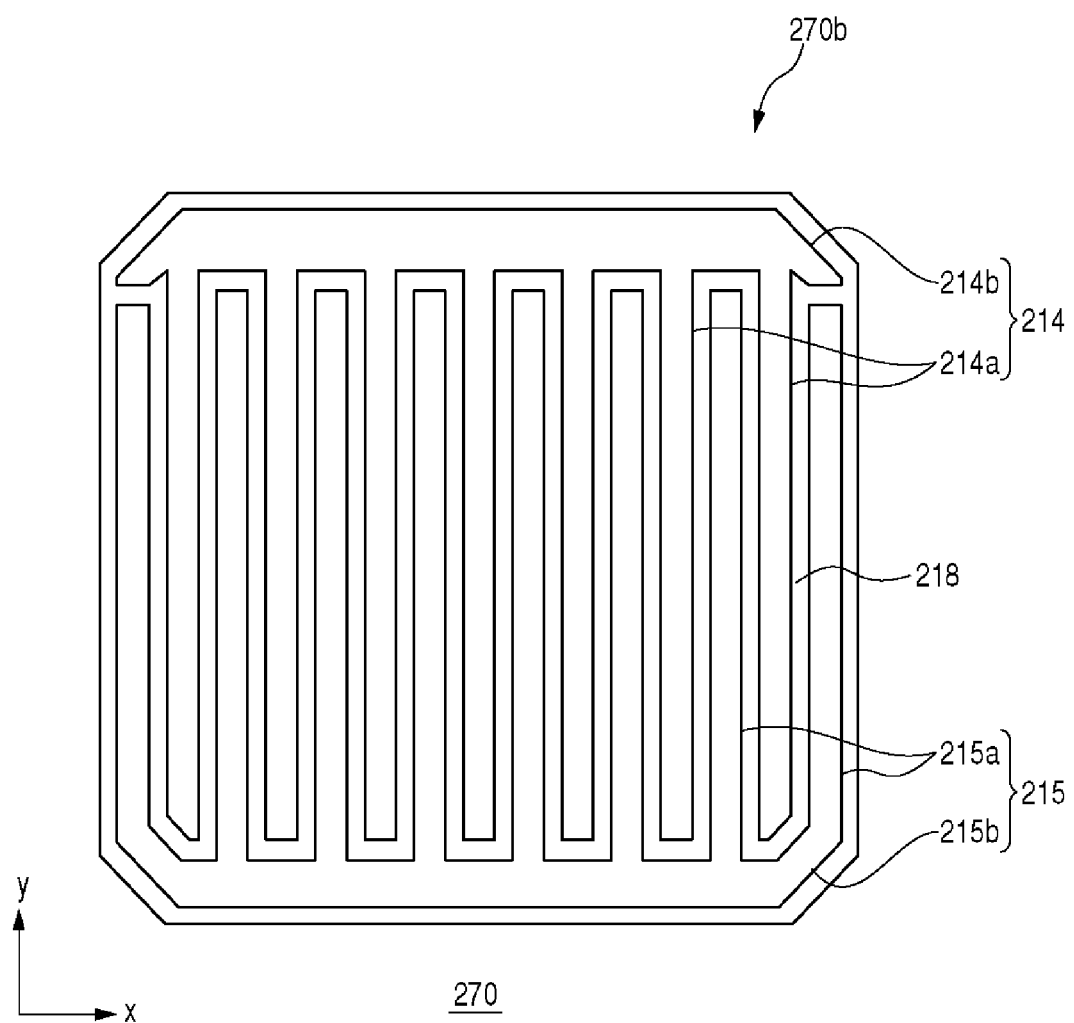
FIG. 32 is a diagram illustrating a back surface of the solar cell element according to the embodiment of the present invention.

FIG. 32 is a diagram illustrating the back surface 270*b* of the solar cell element 270. The first electrode 214 has a plurality of first finger electrodes 214*a* extending in parallel in a y direction and a first bus bar electrode 214*b* connecting the plurality of first finger electrodes 214*a* and extending in an x direction. In the same way, the second electrode 215 has a plurality of second finger electrodes 215*a* extending in parallel in the y direction and a second bus bar electrode 215*b* connecting the plurality of second finger electrodes 215*a* and extending in the x direction. The first finger electrodes 214*a* and the second finger electrodes 215*a* are alternately arranged such that the respective comb teeth engage with each other.

Figure 33:
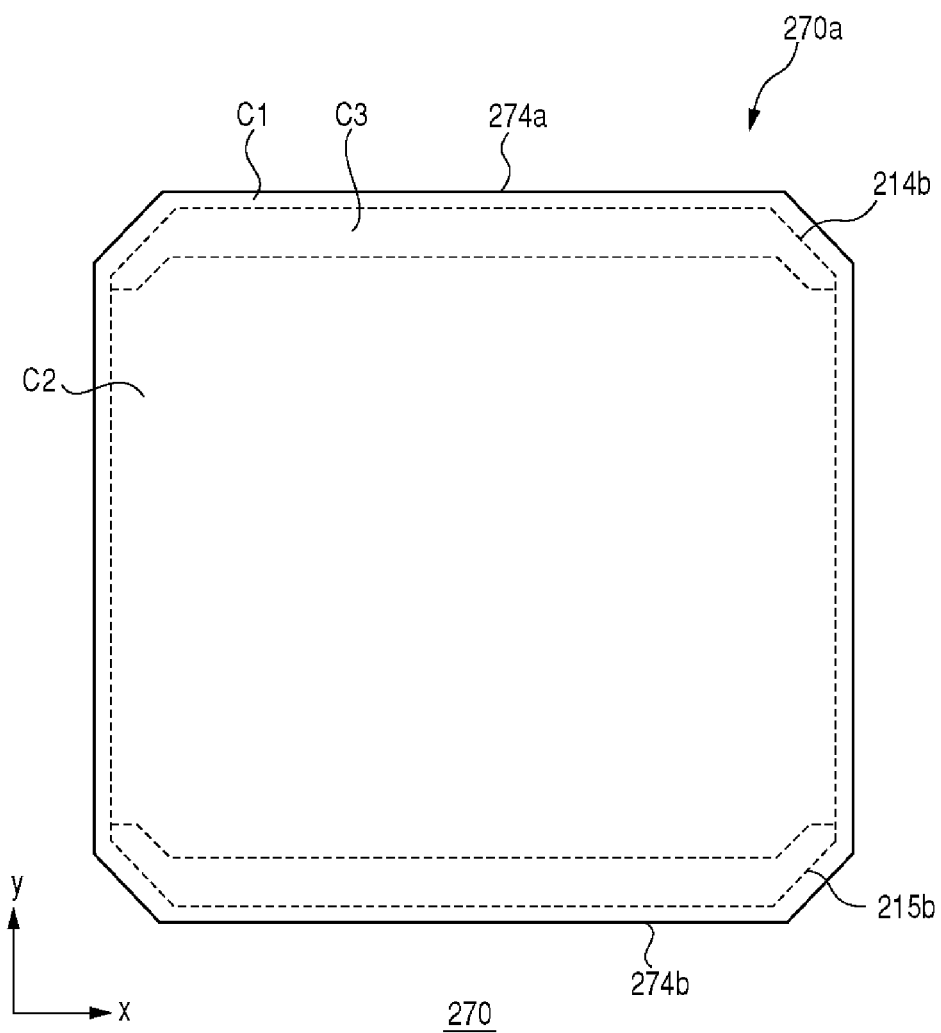
FIG. 33 is a diagram illustrating a light-receiving surface of the solar cell element according to the embodiment of the present invention.

FIG. 33 is a diagram illustrating the light-receiving surface 270*a* of the solar cell element 270. In the figure, areas that face areas in which the first bus bar electrode 214*b* and the second bus bar electrode 215*b* are formed, respectively, on the back surface are indicated by a dashed line. In the back surface junction type solar cell element 270, an inner area C2 facing an area in which the finger electrodes are formed becomes a valid area, and an outer peripheral area C1 and areas C3 in which the bus bar electrodes are formed, respectively, become invalid areas where the efficiency of the generation of electricity is lower than that in the valid area. Therefore, by covering the outer peripheral area C1 and the areas C3 in which the bus bar electrodes are formed, which serve as invalid areas, with a light diffusion portion, light that is heading to the invalid areas can be effectively used in the back surface junction type solar cell element 270. More specifically, the light diffusion portion needs to be formed along the outer periphery of the solar cell element 270, and the width of the light diffusion portion in a short-side direction needs to be increased on sides 274*a* and 274*b* that respectively correspond to the areas C3 in which the bus bar electrodes are provided.

What is claimed is:

1. A solar cell module comprising:
    a solar cell that includes a light receiving surface, a back surface opposed to the light receiving surface, and a side surface extending between the light receiving surface and the back surface;
    a sealing layer that is provided on at least one of the light receiving surface and the back surface; and
    a light diffusion portion that is provided between the solar cell and the sealing layer, wherein:
    the light diffusion portion is provided in an outer peripheral area of the at least one of the light receiving surface and the back surface, and the light diffusion portion is further provided on the side surface,
    the light diffusion portion is raised to form a convexly curved surface with a single peak in a cross section perpendicular to the at least one of the light receiving surface and the back surface,
    the light diffusion portion is formed by applying an electrically insulating white material on the solar cell by screen printing, and
    the electrically insulating white material is an epoxy resin or an acrylic resin in which particles of at least one of titania ($TiO_2$) and alumina ($Al_2O_3$) are dispersed.

2. The solar cell module according to claim 1, wherein the light diffusion portion includes a fine concave-convex structure provided on the convexly curved surface.

3. A solar cell module comprising:
    a solar cell including:

a light receiving surface;
a back surface opposed to the light receiving surface; and
a side surface extending between the light receiving surface and the back surface;
a plurality of finger electrodes that are provided on at least one of the light receiving surface and the back surface and that extend parallel to one another; and
a bus bar electrode that is provided on the at least one of the light receiving surface and the back surface and that extends while intersecting with the plurality of finger electrodes;
a sealing layer that is provided on the at least one of the light receiving surface and the back surface; and
a light diffusion portion that is provided between the solar cell and the sealing layer, wherein:
the at least one of the light receiving surface and the back surface includes a left side and a right side that are parallel to the plurality of finger electrodes and an upper side and a lower side that are parallel to the bus bar electrode,
the light diffusion portion is provided in an outer peripheral area of the at least one of the light receiving surface and the back surface, and the light diffusion portion is further provided on the side surface,
the light diffusion portion is formed by applying an electrically insulating white material on the solar cell by screen printing,
the electrically insulating white material is an epoxy resin or an acrylic resin in which particles of at least one of titania ($TiO_2$) and alumina ($Al_2O_3$) are dispersed,
the light diffusion portion includes a first light diffusion portion provided along the left side or the right side, and
a width of the first light diffusion portion is larger than a width of one of the plurality of finger electrodes.

4. The solar cell module according to claim 3, wherein the light diffusion portion further includes a second light diffusion portion provided along at least either one of the upper side and the lower side, and
wherein a width of the second light diffusion portion is smaller than the width of the first light diffusion portion.

5. The solar cell module according to claim 1, wherein the light diffusion portion is provided on the light receiving surface.

6. The solar cell module according to claim 1, wherein the light diffusion portion is provided on the back surface.

7. The solar cell module according to claim 6, wherein the sealing layer is provided on the back surface of the solar cell and the sealing layer is a white colored sealing layer comprising a resin and particles made of titania.

8. The solar cell module according to claim 3, wherein the light diffusion portion is provided on the light receiving surface.

9. The solar cell module according to claim 3, wherein the light diffusion portion is provided on the back surface.

10. The solar cell module according to claim 9, wherein the sealing layer is provided on the back surface of the solar cell and the sealing layer is a white colored sealing layer comprising a resin and particles made of titania.

11. A solar cell module comprising:
a solar cell that includes a light receiving surface, a back surface opposed to the light receiving surface, and a side surface extending between the light receiving surface and the back surface;
a sealing layer that is provided on at least one of the light receiving surface and the back surface; and
a light diffusion portion that is provided between the solar cell and the sealing layer, wherein:
the light diffusion portion is provided in an outer peripheral area of the at least one of the light receiving surface and the back surface, and the light diffusion portion is further provided on the side surface,
the light diffusion portion is raised to form a convexly curved surface with a single peak in a cross section perpendicular to the at least one of the light receiving surface and the back surface, and
the light diffusion portion is formed of an electrically insulating white material which is an epoxy resin or an acrylic resin in which particles of at least one of titania ($TiO_2$) and alumina ($Al_2O_3$) are dispersed.

12. A solar cell module comprising:
a solar cell including:
a light receiving surface;
a back surface opposed to the light receiving surface;
a side surface extending between the light receiving surface and the back surface;
a plurality of finger electrodes that are provided on at least one of the light receiving surface and the back surface and that extend parallel to one another; and
a bus bar electrode that is provided on the at least one of the light receiving surface and the back surface and that extends while intersecting with the finger electrodes;
a sealing layer that is provided on the at least one of the light receiving surface and the back surface; and
a light diffusion portion that is provided between the solar cell and the sealing layer, wherein:
the at least one of the light receiving surface and the back surface includes a left side and a right side that are parallel to the plurality of finger electrodes and an upper side and a lower side that are parallel to the bus bar electrode,
the light diffusion portion is provided in an outer peripheral area of the at least one of the light receiving surface and the back surface, and the light diffusion portion is further provided on the side surface,
the light diffusion portion is formed of electrically insulating white material which is an epoxy resin or an acrylic resin in which particles of at least one of titania ($TiO_2$) and alumina ($Al_2O_3$) are dispersed,
the light diffusion portion includes a first light diffusion portion provided along the left side or the right side, and
a width of the first light diffusion portion is larger than a width of one of the plurality of finger electrodes.

* * * * *